US009613002B2

(12) United States Patent
Han et al.

(10) Patent No.: US 9,613,002 B2
(45) Date of Patent: Apr. 4, 2017

(54) METHOD OF CALIBRATING TARGET VALUES AND PROCESSING SYSTEMS CONFIGURED TO CALIBRATE THE TARGET VALUES

(71) Applicants: Chang-Ho Han, Hwaseong-si (KR); Dae-Wook Kim, Hwaseong-si (KR); Jin-Young Lee, Yongin-si (KR); Sung-Won Choi, Yongin-si (KR); Byoung-Hoon Kim, Seongnam-si (KR); Han-Hum Park, Suwon-si (KR); Sang-Jin Choi, Incheon (KR); Ja-Hum Ku, Seoul (KR)

(72) Inventors: Chang-Ho Han, Hwaseong-si (KR); Dae-Wook Kim, Hwaseong-si (KR); Jin-Young Lee, Yongin-si (KR); Sung-Won Choi, Yongin-si (KR); Byoung-Hoon Kim, Seongnam-si (KR); Han-Hum Park, Suwon-si (KR); Sang-Jin Choi, Incheon (KR); Ja-Hum Ku, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 670 days.

(21) Appl. No.: 14/067,474

(22) Filed: Oct. 30, 2013

(65) Prior Publication Data
US 2014/0229134 A1     Aug. 14, 2014

(30) Foreign Application Priority Data

Feb. 13, 2013 (KR) .................. 10-2013-0015492

(51) Int. Cl.
*G01N 37/00* (2006.01)
*G06F 17/18* (2006.01)
(Continued)

(52) U.S. Cl.
CPC .......... *G06F 17/18* (2013.01); *G03F 7/70633* (2013.01); *H01L 22/00* (2013.01); *H01L 22/20* (2013.01); *H01L 2924/0002* (2013.01)

(58) Field of Classification Search
CPC ............ H01L 2924/0002; H01L 22/00; H01L 2924/00; H01L 22/20; G06F 17/18; G03F 7/70633
See application file for complete search history.

(56) References Cited

U.S. PATENT DOCUMENTS 6,782,596 B2 *  8/2004  Miller ................... B23Q 17/20
                                                29/407.05
6,826,743 B2    11/2004 Park et al.
(Continued)

FOREIGN PATENT DOCUMENTS

KR      10-0597766        7/2006

OTHER PUBLICATIONS

English Abstract for Publication No. 10-2005-0068775 (for 10-0597766).

*Primary Examiner* — Elias Desta
(74) *Attorney, Agent, or Firm* — F. Chau & Associates, LLC

(57) ABSTRACT

A processing method includes processing a wafer based on initial data, measuring errors for each of the plurality of areas, calculating an error similarity of at least some of the plurality of areas as a function of a separation distance between each pair of some of the areas, selecting a first area and a plurality of second areas adjacent to the first area, calculating weight values for the second areas based on the error similarities between each pair of second areas and the error similarities between the first area and each second area, calculating an estimated error of the first area based on the measured errors of the second areas and the weight values (Continued)

for the second areas, and generating estimated data based on the estimated errors for each of the plurality of areas.

20 Claims, 26 Drawing Sheets

(51) Int. Cl.
    *H01L 21/66*     (2006.01)
    *G03F 7/20*     (2006.01)

(56) References Cited

U.S. PATENT DOCUMENTS 8,597,489 B2 * 12/2013 Luo .......................... B23H 3/04
    205/652
2011/0207247 A1     8/2011  Hwang

* cited by examiner $1 \leq k \leq 2$

METHOD OF CALIBRATING TARGET VALUES AND PROCESSING SYSTEMS CONFIGURED TO CALIBRATE THE TARGET VALUES

CROSS-REFERENCE TO RELATED APPLICATION

This application claims priority under 35 U.S.C. §119 from Korean Patent Application No. 10-2013-0015492 filed in the Korean Intellectual Property Office on Feb. 13, 2013, and all the benefits accruing therefrom, the contents of which are herein incorporated by reference in their entirety.

BACKGROUND

1. Technical Field

Embodiments of the inventive concept are directed to a method and system for processing a workpiece, such as a wafer or a display panel, by calibrating or offsetting an overlay, an error, a process parameter, or a target value.

2. Discussion of the Related Art

A process of producing a semiconductor device and a panel may include processing various wafers or display panels. The processing processes do not always obtain uniform results but rather obtain uneven results that have irregular errors. Accordingly, a process of producing a semiconductor device may include continuously calibrating process conditions that reflect results of processing a workpiece. A process of producing a semiconductor should include precisely analyzing the process results, and correct the process results in the next process.

SUMMARY

Embodiments of the inventive concepts provide methods and systems that practically apply the Kriging method from geostatistics.

Embodiments of the inventive concept provide a method and system for calibrating an overlay, an error, a process parameter, or a target value in a semiconductor fabrication process.

Other embodiments of the inventive concept provide a method and processing system for fabricating a semiconductor by calibrating an overlay, an error, a process parameter, or a target value.

Other embodiments of the inventive concept provide a method and system for fabricating a semiconductor by sampling an overlay, an error, a process parameter, or a target value.

Other embodiments of the inventive concept provide a method and system for fabricating a semiconductor by estimating an overlay, an error, a process parameter, or a target value.

Other embodiments of the inventive concept provide a method and system for variously treating, processing, or converting data, including an overlay, an error, a process parameter, or a target value, in a semiconductor fabrication process.

Aspects of the inventive concept are not limited by the above description, and other unmentioned aspects will be clearly understood by one of ordinary skill in the art from embodiments described herein.

In accordance with an aspect of the inventive concept, a processing method includes processing a workpiece having a plurality of areas using initial data, measuring errors for each of the plurality of areas, calculating an error similarity of at least some of the plurality of areas as a function of a separation distance between each pair of some of the areas, selecting a first area and a plurality of second areas adjacent to the first area, calculating weight values for the second areas based on the error similarities between each pair of second areas and the error similarities between the first area and each second area, calculating an estimated error of the first area based on the measured errors of the second areas and the weight values for the second areas, and generating estimated data based on the estimated errors for each of the plurality of areas.

In accordance with another aspect of the inventive concept, a processing method includes processing a first workpiece having a plurality of areas based on initial data, generating measured data including measuring errors of the plurality of areas, determining as outliers those areas for which an absolute value of an outlier factor is greater than a criterial outlier factor, removing the measured errors of those areas determined as outliers from the measured data to generate sampled data, calculating estimated errors of the plurality of areas based on the measured errors of the plurality of areas, adding the estimated errors to the sampled data to generate estimated data, comparing the estimated data with the initial data to generate calibrated data, and processing a second workpiece based on the calibrated data.

In accordance with another aspect of the inventive concept, a processing system includes a processing part configured to process a workpiece having a plurality of areas based on initial data, a measuring part configured to measure errors of the plurality of areas and generate measured data, a sampling part configured to remove some of the measured errors from the measured data and generate sampled data, an estimating part configured to calculate estimated errors of the plurality of areas, add the estimated errors to the sampled data, and generate estimated data, and a computing part configured to compare the estimated data with the initial data and generate calibrated data. The estimating part calculates an error similarity of at least some of the plurality of areas as a function of a separation distance between pairs of areas in the plurality of areas, selects a first area and a plurality of second areas adjacent to the first area, calculates weight values for the second areas based on the error similarities between each pair of second areas and the error similarities between the first area and each second area, and calculates an estimated error of the first area based on the measured errors of the second areas and the weight values for the second areas.

In accordance with another aspect of the inventive concept, a processing system includes a processing part configured to process a workpiece having a plurality of areas based on initial data, a measuring part configured to measure errors of the plurality of areas and generate measured data, a sampling part configured to determine whether or not the measured errors are outliers, remove measured errors of those areas which are determined to be outliers from the measured data and generate sampled data, an estimating part configured to calculate estimated errors of the plurality of areas, add the estimated errors to the sampled data and generate estimated data, and a computing part configured to compare the estimated data with the initial data and generate calibrated data. Determining whether or not the measured errors are outliers includes selecting one of the plurality of areas and selecting at least two second areas disposed adjacent to the selected area, calculating a weighted mean of the selected area based on the measured errors of the at least two adjacent second areas, calculating an outlier factor of the selected area based on the weighted mean, setting a criterial outlier factor, and determining as outliers those areas for which an absolute value of its outlier factor is greater than the criterial outlier factor.

Specific particulars of other embodiments are included in detailed descriptions and drawings.

DETAILED DESCRIPTION OF EXEMPLARY EMBODIMENTS

Various embodiments will now be described more fully with reference to the accompanying drawings in which exemplary embodiments are shown. This inventive concept may, however, be embodied in different forms and should not be construed as limited to the embodiments set forth herein.

Like numbers refer to like elements throughout. The drawings are not necessarily to scale, emphasis instead being placed upon illustrating the principles of the inventive concepts.

Figure 1:
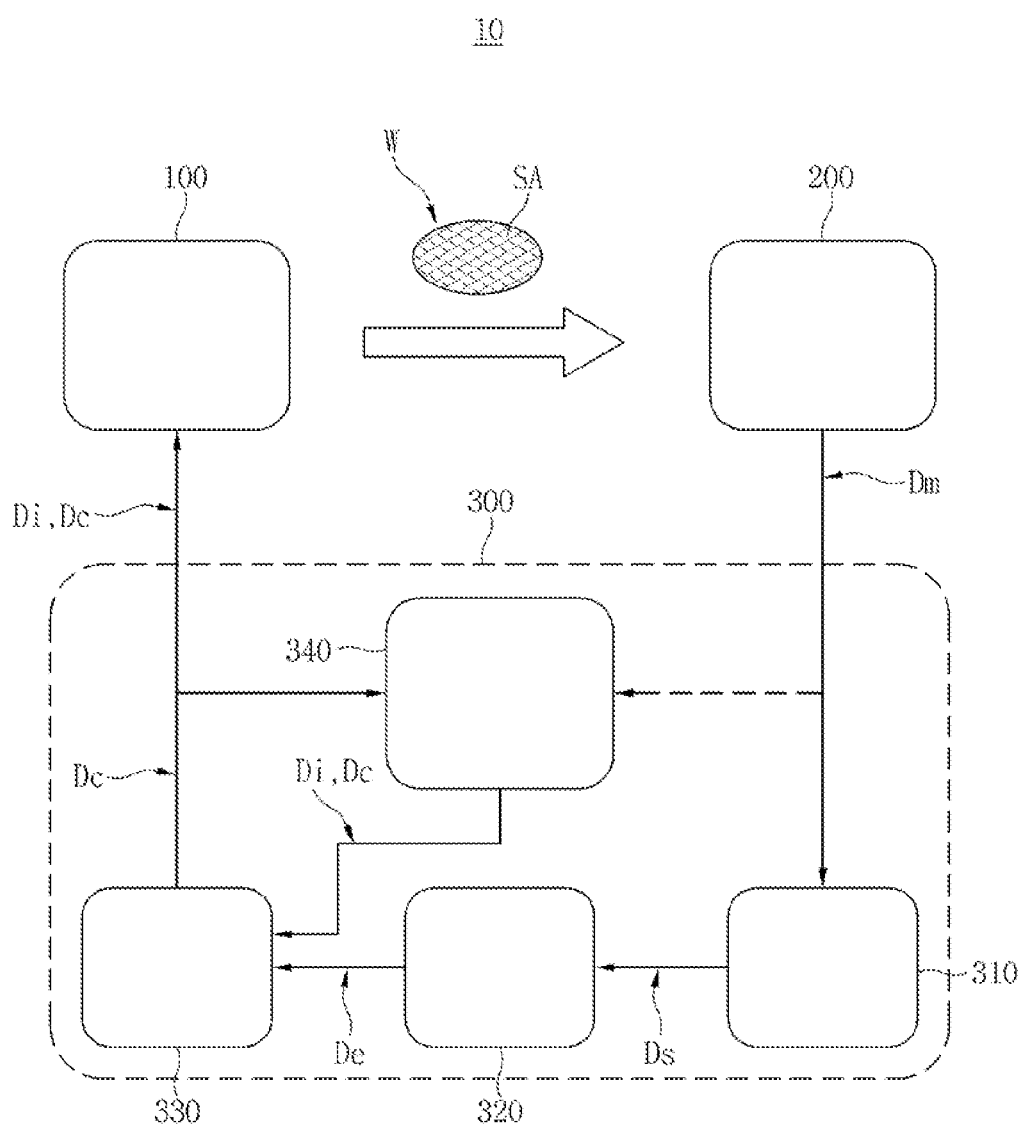
FIG. 1 is a block diagram of a processing system according to embodiments of the inventive concept.

FIG. 1 is a block diagram of a processing system 10 according to embodiments of the inventive concept. The processing system 10 may process a wafer W and generate a calibrated or offset overlay, error, and various target values based on pre-processing overlays, errors, and target values, and post-processing overlays, errors, and various other target values. For example, the processing system 10 may process the wafer W, measure an overlay, an error, or various other target values of the processed wafer W, calibrate or offset an overlay, an error, target values, process parameters, and various other conditions such that the overlay, error, or various other target values of the processed wafer W more closely approximate the targeted values, and repetitively process the wafer W based on the calibrated or offset overlays, errors, target values, process parameters, and under various other conditions. In addition, the processing system 10 may perform various processes, such as a deposition process, an etching process, a planarization process, such as a chemical mechanical polishing (CMP) process or an etch-back process, an ion injection process, and a metallization process, according to initial objectives, measure process results to calibrate or offset the initial objectives, and repetitively perform the processes according to the calibrated or offset objectives.

Referring to FIG. 1, the processing system 10 may include a processing part 100, a measuring part 200, and a data processing part 300. The data processing part 300 may include a sampling part 310, an estimating part 320, a computing part 330, and a database 340.

The processing part 100 may process the wafer W in a semiconductor fabrication process. For example, the processing part 100 may perform a photolithography process, a deposition process, an etching process, a planarization process such as a CMP process, an ion injection process, or a metallization process. In an exemplary embodiment, a photolithography process is performed, however embodiments of the inventive concept are not limited thereto. The processing part 100 may perform a pre-process using an initial overlay value, an initial error, or various other initial target values, which are set, determined, and/or distributed based on initial data Di, and perform a post-process using a calibrated overlay value, a calibrated error, or various other calibrated target values, which are reset, determined, and/or distributed based on calibrated data Dc. For example, the initial overlay value, error, and various other targets may specify an ideal position or coordinates of shot areas SA in an X direction and/or Y direction, and the pre-process may move the shot areas SA as specified.

Positions or coordinates of the shot areas SA may refer to initial start points of the respective shot areas SA. That is, in each of the shot areas SA, a photolithography process may be initiated in a position that has been shifted from an ideal position due to calibrated overlay, error, or target values of the calibrated data Dc. The photolithography process may be repeated. Alternatively, a first calibrated or offset photolithography process may be performed based on the first calibrated or offset overlay, error, or various other target values, and a second calibrated or offset photolithography process may be performed based on second calibrated or offset overlay, error, or various other target values. In addition, in other embodiments, the photolithography process may be repeated for each of the shot areas SA of the wafer W. If the initial data Di includes an overlay target value, the initial data Di may include values resulting from the ideal overlay target coordinates being shifted in an X or Y direction. That is, the photolithography process may not be initialized and performed in the ideal coordinates for each of the shot areas SA, but may rather be initialized and performed in the shifted coordinates of each of the shot areas SA. The ideal coordinates may refer to coordinates in which an overlay error or alignment error is zero (0). The initial data Di may be a wafer map or a table on which target values are indicated. Alternatively, the initial data Di may have a set of polynomial regression coefficients for calculating target values.

When the processing part 100 performs other processes, such as a deposition process, an etching process, a planarization process such as a CMP process, an ion injection process, or a metallization process, the initial processes may be performed according to a temperature, time, pressure, or various other initial target process values, and calibrated processes may be performed according to calibrated target values. The wafer W processed by the processing part 100 may be transferred and provided to the measuring part 200.

The measuring part 200 may measure processing results of the wafer W processed by the processing part 100, and generate measured data Dm. For example, the measuring part 200 may include optical measuring equipment, a scanning electron microscope (SEM), or high-resolution measuring equipment such as an X-ray photoelectron spectroscopy (XPS) system.

Although the measuring part 200 may measure all the shot areas SA (of FIG. 3), the measuring part 200 may sample shot areas SA, select measured shot areas SAm (of FIG. 5A to 5C), and measure selected measured shot areas SAm to improve throughput and productivity. For example, the measured shot areas SAm may be sampled from all shot areas SA in various arrangements, such as concentric circles, polygons, crossing lines, lattices, or several congregate areas, or be randomly sampled from all shot areas SA without specific rules.

The measured data Dm may be a wafer map or a table that includes measured overlays, errors, or results of measured shot areas SAm. For example, the measured data Dm may include overlay errors of the measured shot areas SAm, alignment errors of the measured shot areas SAm or patterns, or size errors, thickness errors, width errors, length errors, depth errors, or various other errors of the patterns, which may correspond to the results of the performed processes. The measured data Dm may be provided to the data processing part 300 through a network, such as a local bus or a wired/wireless local area network (LAN). The measured data Dm provided to the data processing part 300 may be provided to the sampling part 310 and additionally provided to and stored in the database 340.

The data processing part 300 may receive the measured data Dm from the measuring part 200 and perform various processes.

The sampling part 310 may remove outliers with abnormal values from the measured data Dm, and generate sampled data Ds including only inliers. For example, the sampling part 310 may remove measured results of the measured shot areas SAm, which have an abnormal overlay, an abnormal error, or various other abnormal target values. That is, a measured shot area SAm, which is determined to be an outlier, may be regarded as an unmeasured shot area SAn (of FIG. 5A to 5C). A method of determining and removing outliers will be described below. The sampled data Ds may include a wafer map, a table, or a set of polynomial regression coefficients. The sampled data Ds may be provided to the estimating part 320 through an internal bus or a wired/wireless network.

The estimating part 320 may analyze the sampled data Ds, estimate measured values of unmeasured shot areas SAn, and generate measured results and estimated data De including estimated results. That is, the estimated data De may include measured values, measured errors, estimated values, or estimated errors of all the shot areas SA of the wafer W. The estimated data De may include a wafer map, a table, or a set of polynomial regression coefficients. The estimated data De may be provided to the computing part 330 through the internal bus or the wired/wireless network. A method of generating the estimated data De will be described below. The sampling part 310 and the estimating part 320 may continuously perform processes in a single processing part.

The computing part 330 may compare the estimated data De with the initial data Di, and generate calibrated data Dc. The calibrated data Dc may include offset differences between the estimated data De and the initial data Di. For example, the calibrated data Dc may include a calibrated overlay, a calibrated error, or various other target values. The calibrated data Dc may include a wafer map, a table, or a set of polynomial regression coefficients. The calibrated data Dc may be provided to the processing part 100 and/or the database 340 through the internal bus or the wired/wireless network.

The database 340 may store various data and provide the various data to the other functional parts and/or equipment. For example, the database 340 may entirely or selectively store the initial data Di, the measured data Dm, the sampled data Ds, the estimated data De, or the calibrated data Dc, and provide the initial data Di, the measured data Dm, the sampled data Ds, the estimated data De, or the calibrated data Dc to internal components or other process equipment and control systems.

Thereafter, the processing part 100 may receive the calibrated data De from the computing part 330 or the database 340, and process the next wafer W based on the calibrated target values. The above-described processes may be repeated.

Figure 2A:
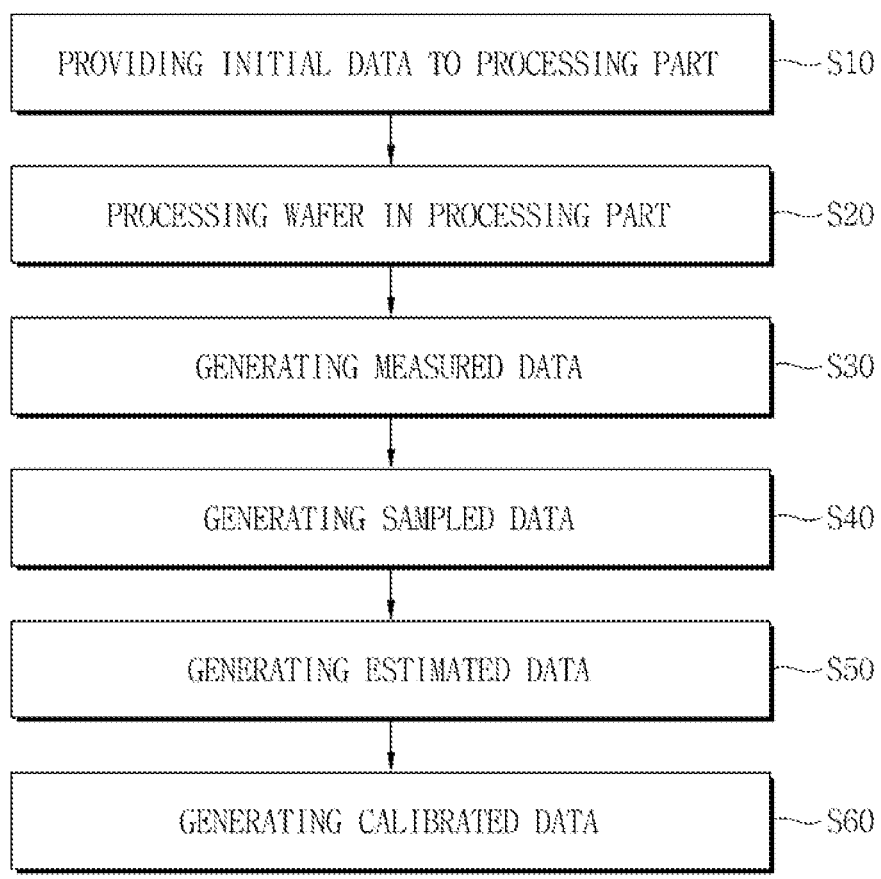
FIGS. 2A through 2C are flowcharts of processing methods according to embodiments of the inventive concept.
Figure 2B:
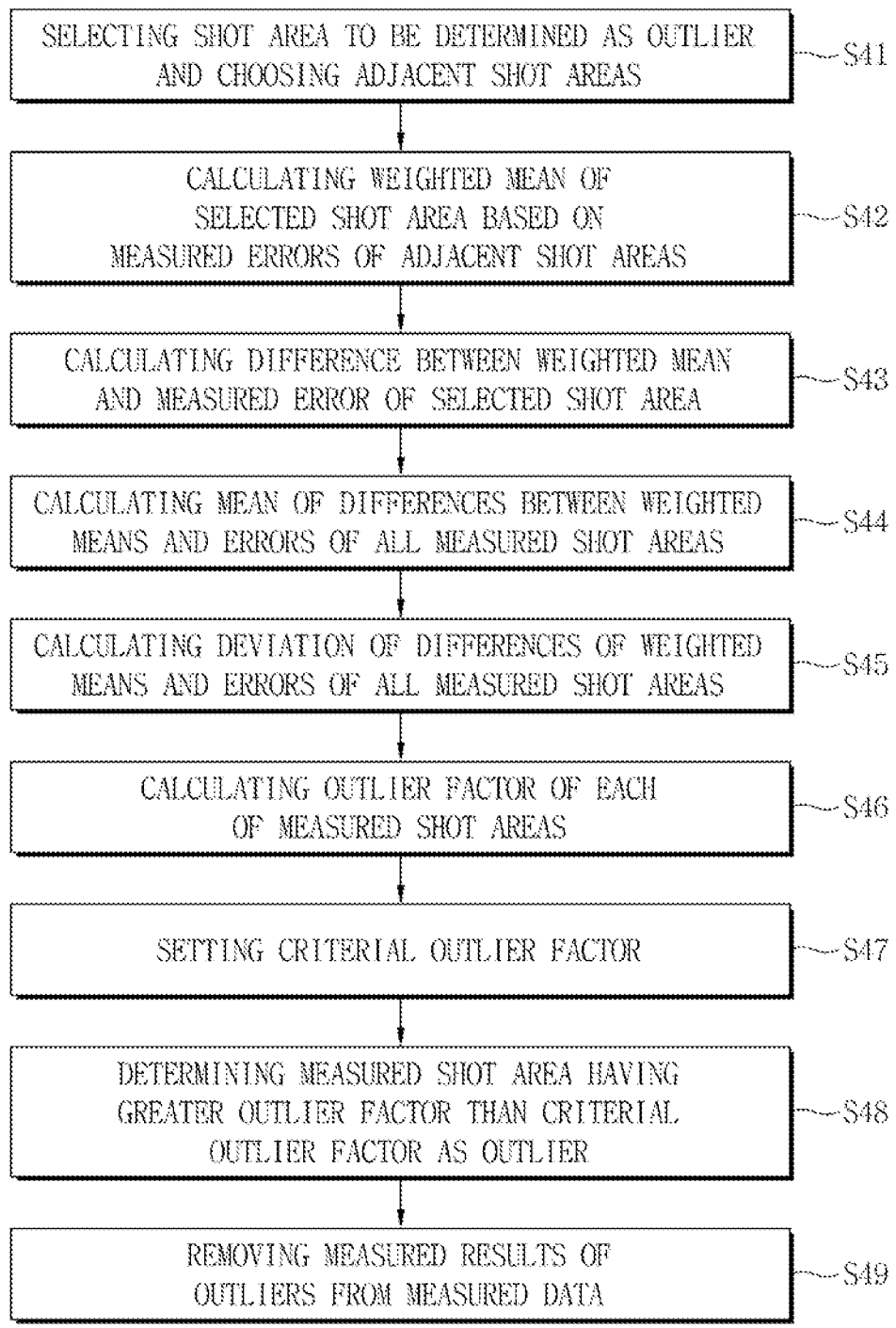
Figure 2C:
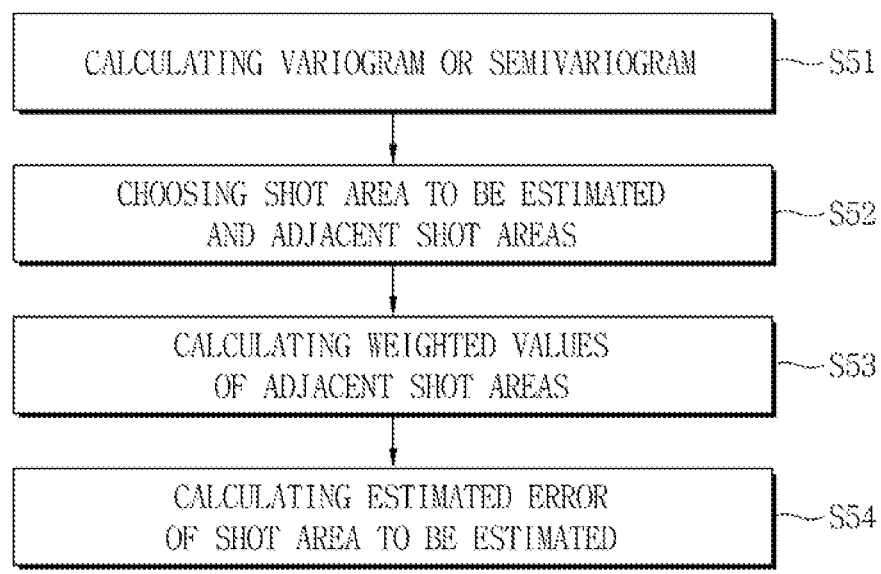

FIGS. 2A through 2C are flowcharts of processing methods, and FIGS. 3 through 10C are diagrams that illustrating processing methods according to embodiments of the inventive concept. Hereinafter, a method of performing processes using the processing system 10 shown in FIG. 1 will be described. In addition, non-limiting embodiments may assume that the processing part 100 includes photolithography equipment, and a photolithography process is performed within the processing part 100. Accordingly, embodiments of the disclosure may assume that the photolithography process includes measuring an overlay error and calibrating or offsetting the overlay error. An overlay may refer to a shift of location of a pattern in precise coordinates or an overlap degree between a lower pattern and an upper pattern, and an overlay error may refer to an overlay skew measured with respect to zero (0), which is an ideal overlay value. Ideally, the overlay error may be as close to zero (0) as possible.

Figure 3:
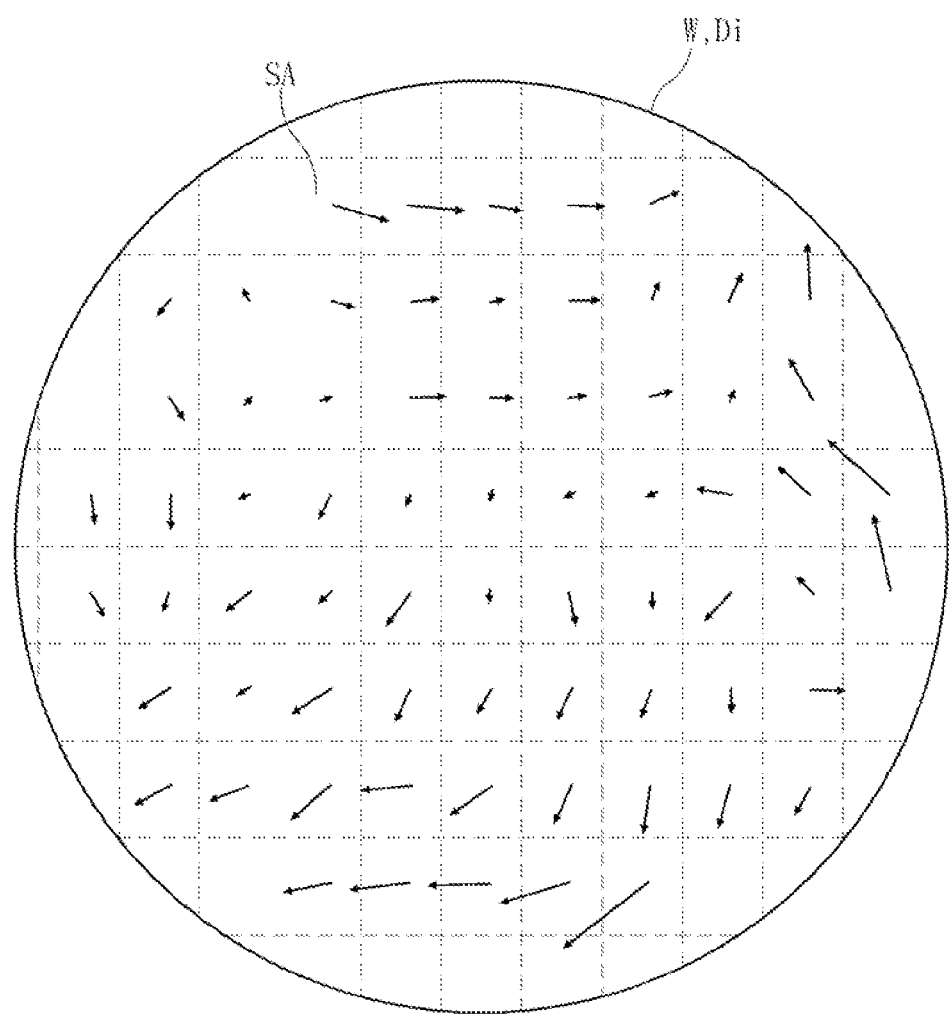
FIGS. 3 through 10C are diagrams that illustrate processing methods according to embodiments of the inventive concept.

Referring to FIGS. 2A and 3 and Table 1, a processing method may include providing initial data Di to the processing part 100 (S10). The initial data Di may include initial process target values, initial overlay target values, or initial calibrated overlay target values of all shot areas SA. An initial target value may be a vector for a wafer map, or a table with numerical values for respective shot areas SA. Alternatively, the initial target value may include coordinates of each of shot areas SA, which may be calculated using a set of polynomial regression coefficients.

Referring to FIG. 3, initial target values, initial overlays, or initial calibrated overlays of a process of processing the wafer W, which will be performed based on the initial data Di, may be conceptually provided as a wafer map. Hereinafter, target values or error values will be used for brevity. The target values may refer to various numerical values before processes are performed while the error values may refer to various numerical values obtained by measuring process results after the processes are performed. In addition, embodiments of the inventive concept include processes of calibrating or offsetting overlay errors. Accordingly, numerical values of X-components and Y-components of data described below may be described separately or together.

Referring to Table 1, the initial data Di may be provided as a table. Specifically, the initial data Di may include an X-component target value $X_{target}$ and a Y-component target value $Y_{target}$ for each of the shot areas SA. For brevity, the X-component target value $X_{target}$ and the Y-component target value $Y_{target}$ of each of the shot areas SA are represented by integers without units. Any convenient unit may be used for each piece of equipment. For example, mil, fm, pm, nm, μm, or other units may be used.

TABLE 1

| Shot area | | Target values | |
|---|---|---|---|
| X position | Y position | $X_{target}$ | $Y_{target}$ |
| ... | ... | ... | ... |
| −5 | −4 | 8 | 7 |
| −5 | −3 | 8 | 9 |
| ... | ... | ... | ... |
| −2 | 1 | 10 | 8 |
| ... | ... | ... | ... |
| 1 | −2 | −9 | −7 |
| ... | ... | ... | ... |
| 5 | 4 | −8 | −9 |
| 5 | 5 | −8 | −7 |
| ... | ... | ... | ... |

Alternatively, the initial data Di may include a set of polynomial regression coefficients. The set of polynomial regression coefficients may include a set of coefficients by which target values or errors of the shot areas SA of the wafer W may be estimated using a least-squares method. For example, a cubic least-squares method may be used to obtain $k_1$ through $k_{20}$ that satisfy EQS. (1) and (2):

$$X_{target}=k_1+k_3X+k_5Y+k_7X^2+k_9XY+k_{11}Y^2+k_{13}X^3+k_{15}X^2Y+k_{17}XY^2+k_{19}Y^3 \quad (1), \text{ and}$$

$$Y_{target}=k_2+k_4Y+k_6X+k_8Y^2+k_{10}XY+k_{12}X^2+k_{14}Y^3+k_{16}XY^2+k_{18}X^2Y+k_{20}X^3 \quad (2),$$

wherein $X_{target}$ denotes an X-component target value of each shot area, $Y_{target}$ denotes a Y-component target value of each shot area, X and Y denote coordinates of each shot area, and $k_1$ to $k_{20}$ are coefficients. In other embodiments, the initial data Di may include 12 coefficients calculated using a quadratic least-squares method, or the initial data Di may include 30 coefficients calculated using a quartic least-squares method.

X and Y may refer to positional coordinates of a specific alignment key of each of the shot areas SA, or coordinates of a start point. X and Y may be understood with further reference to FIGS. 8A through 8C.

In addition, although omitted in Equations (1) and (2), error constants $\epsilon_x$ and $\epsilon_y$ that represent equipment characteristics may be further included in Equations (1) and (2). That is, EQS. (1) and (2) may be expanded to obtain EQS. (3) and (4):

$$X_{target}=k_1+k_3X+k_5Y+k_7X^2+k_9XY+k_{11}Y^2+k_{13}X^3+k_{15}X^2Y+k_{17}XY^2+k_{19}Y^3+\epsilon_x \quad (3),$$

$$Y_{target}=k_2+k_4Y+k_6X+k_8Y^2+k_{10}XY+k_{12}X^2+k_{14}Y^3+k_{16}XY^2+k_{18}X^2Y+k_{20}X^3+\epsilon_y \quad (4),$$

wherein $\epsilon_x$ and $\epsilon_y$ denote error constants of each piece of equipment.

The error constants $\epsilon_x$ and $\epsilon_y$ may be obtained based on characteristics of each piece of process equipment, and may reduce data errors and perform optimum processes.

Figure 4A:
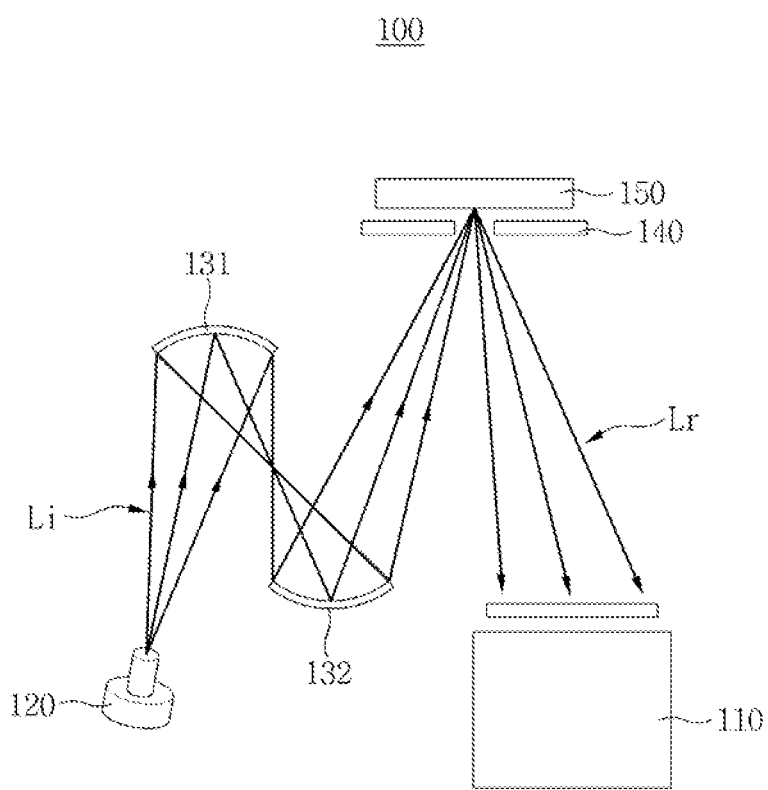
Figure 4B:
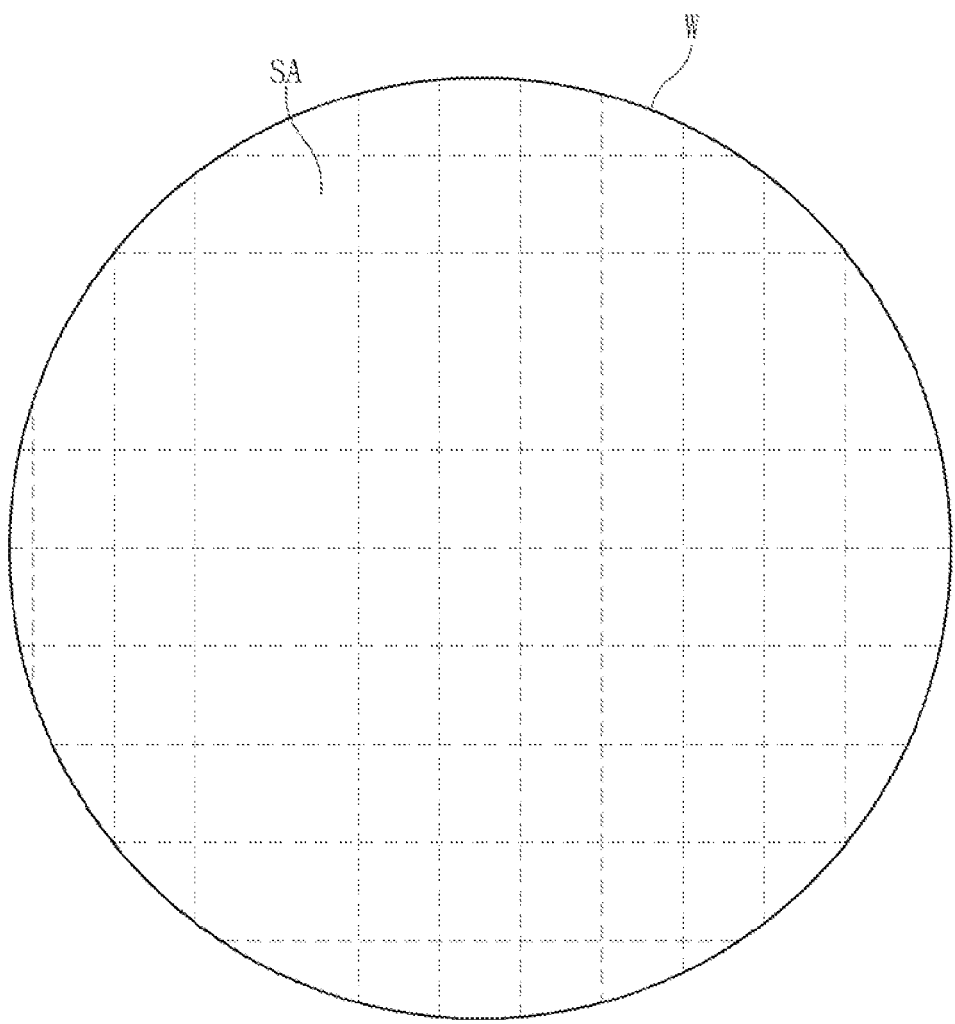

Referring to FIGS. 2A, 4A, and 4B, a method of calibrating errors may include pre-processing a wafer W in the processing part 100 (S20). Specifically, the method may include pre-processing the wafer W based on an initial target value of initial data Di. For example, if the processing part 100 includes photolithography equipment, the processing part 100 may perform a photolithography pre-process based on the input initial target value of the initial data Di, and process the wafer W.

Referring now to FIG. 4A, the processing of the wafer W may include mounting a wafer W with a photoresist layer on a stage 110, irradiating light Li from a light source 120 through mirrors 131 and 132 and a scanning slit 140 onto a photomask 150, and reflecting light Lr from the photomask 150 onto the wafer W. The stage 110 may move in an X direction and a Y direction, and the scanning slit 140 may move in the Y direction. In addition, the processing of the wafer W may include forming the photoresist layer on the wafer W, exposing the photoresist layer using a photolithography process, and developing the exposed photoresist layer to form a photoresist pattern.

The wafer W on which the photolithography process is performed may include a plurality of shot areas SA. The shot areas SA may be areas exposed using a single photolithography process. Dotted lines may refer to imaginary boundaries between the shot areas SA. In other embodiments, the wafer W on which the photolithography process is performed may include an inorganic material pattern or a metal pattern, and the photolithography process may be performed by an etching process using the photoresist pattern as an etch mask and then removing the photoresist pattern. Referring back to FIG. 1, the wafer W on which the photolithography process is performed may be transferred and provided to the measuring part 200.

Referring to FIGS. 2A and 5A through 5C, a processing method may include generating measured data Dm (Dmt, Dmx, Dmy) in the measuring part 200 (S30). For example, the generation of the measured data Dm may include selecting shot areas SAm to be measured from the shot areas SA of the processed wafer W, measuring results of the process performed on the shot areas SAm to be measured, and indicating the measured results R (Rt, Rx, Ry) as a wafer map or a table. The measured results R (Rt, Rx, Ry) may include target errors or overlay errors. The target errors may include differences between ideal target values and measured values. The overlay errors may include differences between ideal overlay target coordinates and measured overlay coordinates. For example, the overlay errors may refer to an overlap degree, a degree of vertical alignment, or deviation degree between an inorganic pattern or metal pattern included in the wafer W and an organic pattern, such as a photoresist pattern, formed on the wafer W.

As described above, the selected measured shot areas SAm may be arranged in various patterns, such as a concentric circle, a polygon, crossing lines, lattices, several congregate areas, etc. In a present non-limiting embodiment, the selected measured shot areas SAm may be arranged as concentric circles or concentric polygons. The measured results R (Rt, Rx, Ry) may have various trends. The shot areas SA may include measured shot areas SAm and unmeasured shot areas SAn.

Hereinafter, the measured results R (Rt, Rx, Ry) will be referred to as errors R (Rt, Rx, Ry), and described. That is, the measured results R (Rt, Rx, Ry) may include various numerical values and have various meanings and will be expressed by the term "errors" for brevity. Accordingly, the word "errors" as used in the present disclosure may be understood as having various meanings, for example, differences or results, such as sizes, thicknesses, lengths, widths, depths, positions, coordinates, or shapes. For example, in the present disclosure, "errors" may be understood as "overlay values" or "overlay errors".

Figure 5A:
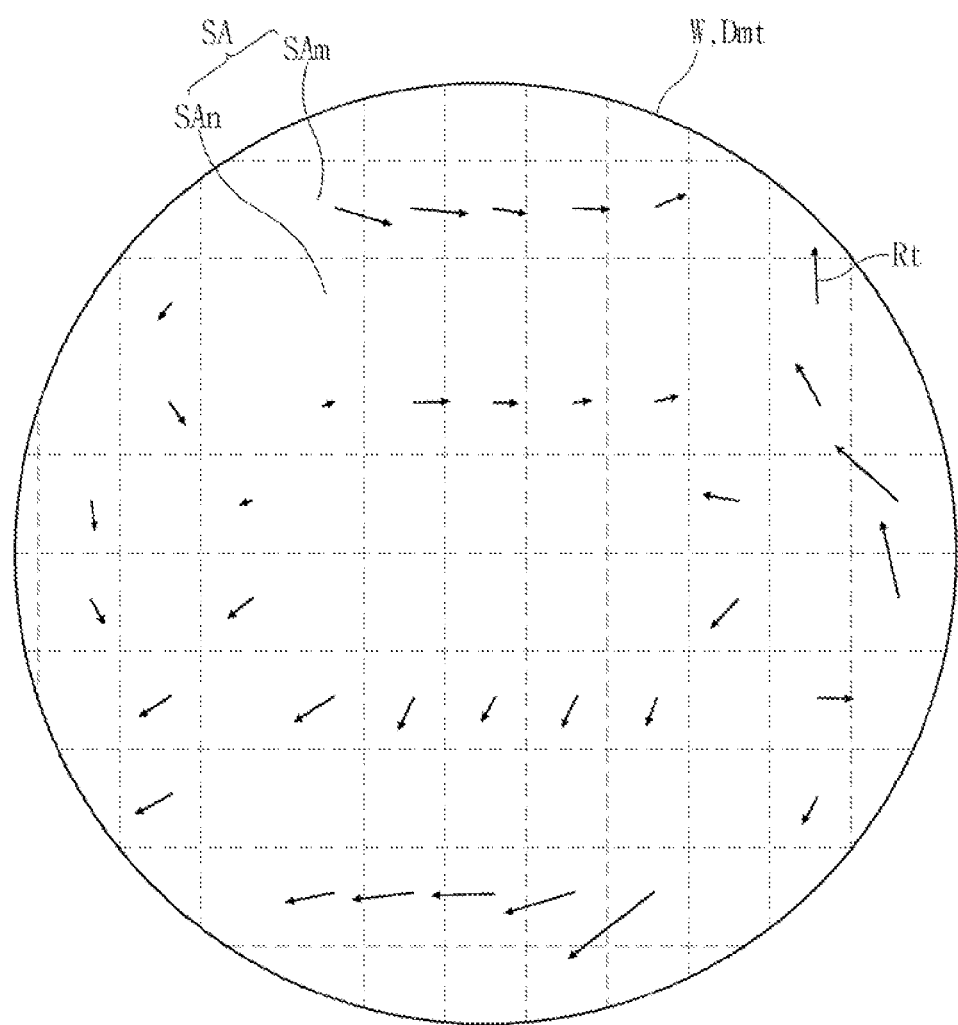
Figure 5B:
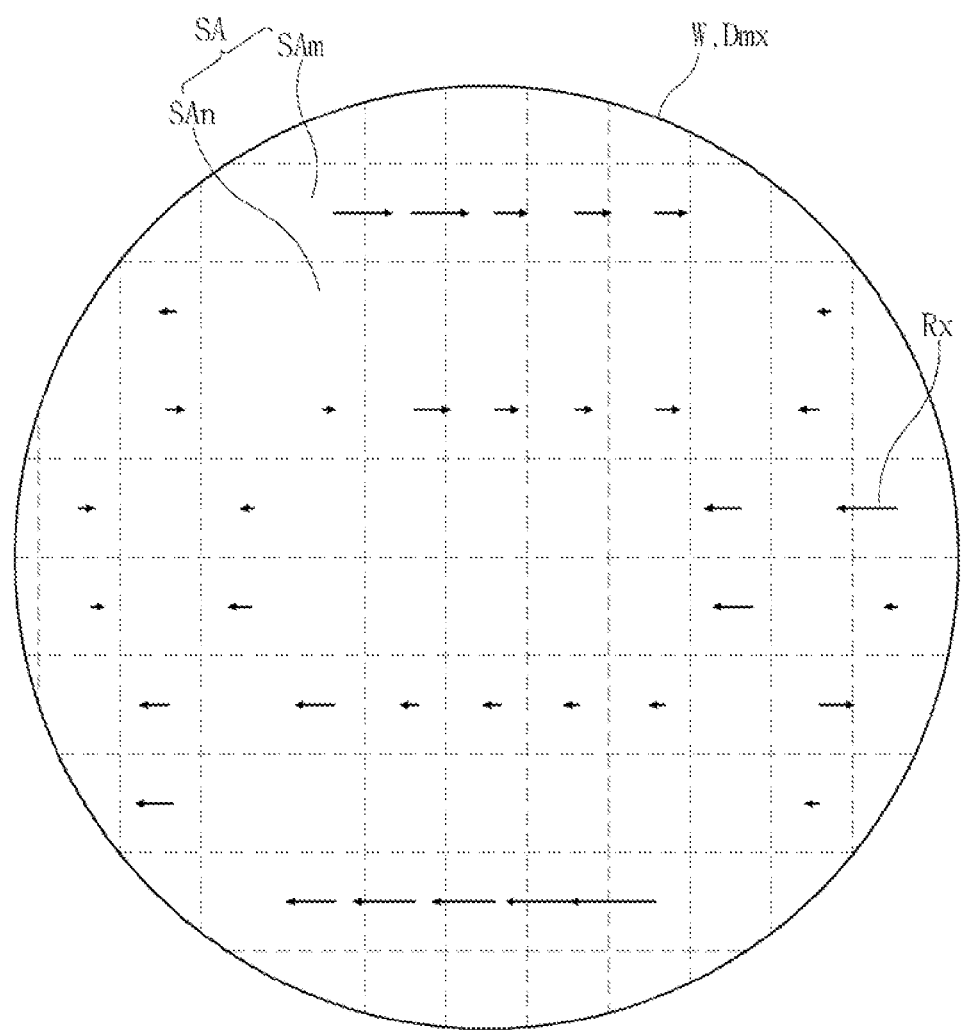
Figure 5C:
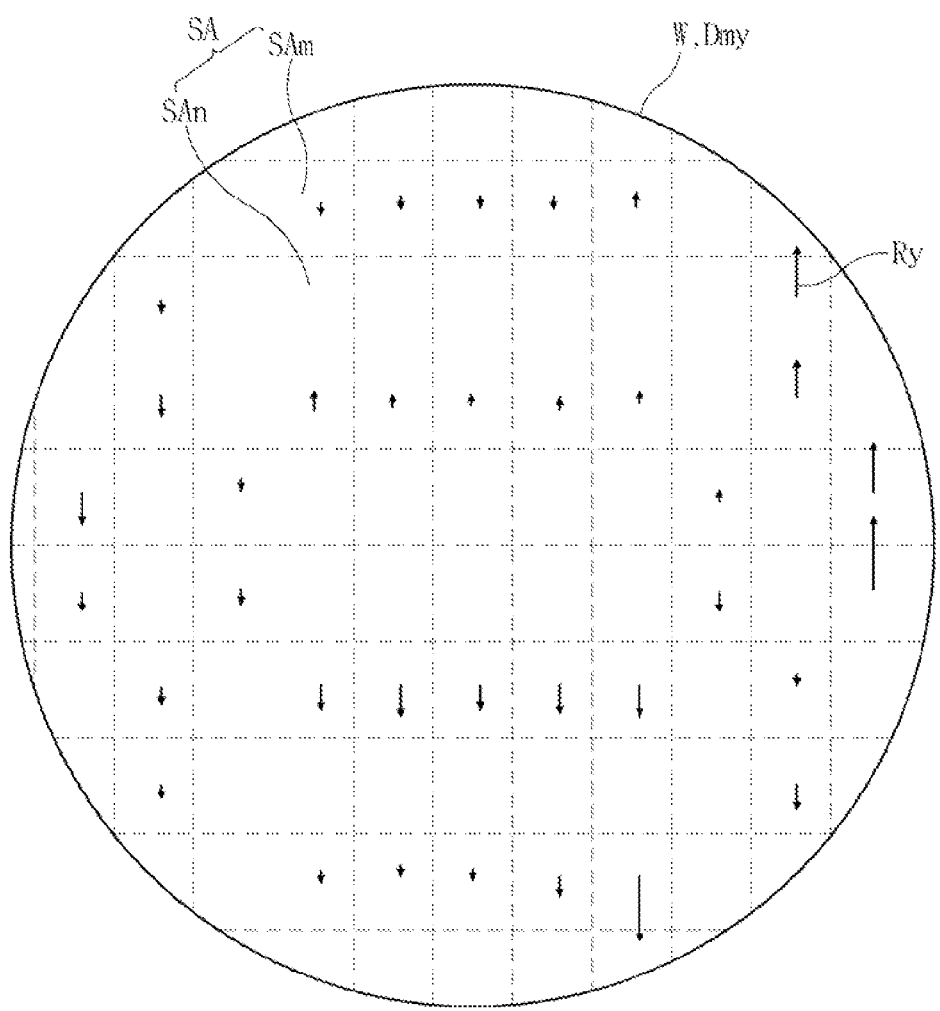

Referring to FIG. 5A, Dmt refers to unified measured data that may include unified errors Rt which include widthwise errors, such as X-component errors Rx, and lengthwise errors, such as Y-component errors Ry. Referring to FIG. 5B, the X-component measured data Dmx may selectively include the X-component errors Rx. Referring to FIG. 5C, the Y-component measured data Dmy may selectively include Y-component errors Ry. The errors R (Rt, Rx, Ry) may represent various directions (error directions) and lengths (error sizes) as indicated by arrows. Hereinafter, a widthwise component will be referred to as an X component, and a lengthwise component will be referred to as a Y component.

The measuring part 200 may generate unified measured data Dmt, individually separate or extract X-component errors Rx and Y-component errors Ry from the unified measured data Dmt, and generate X-component measured data Dmx and Y-component measured data Dmy. Alternatively, the X-component measured data Dmx may be generated by the X-component errors Rx, while the Y-component measured data Dmy may be generated by measuring the Y-component errors Ry. In other embodiments, the separation of the X-component measured data Dmx and the Y-component measured data Dmy may be performed by the data processing part 300.

Referring back to FIG. 4A, as described above, the X component may correspond to a stepping direction in which the stage 110 of the photolithography equipment moves to target each of the shot areas SA, while the Y component may correspond to a scanning direction in which the scanning slit 140 or the stage 110 of the photolithography equipment moves to expose each of the shot areas SA. Conversely, the Y component may be the stepping direction, while the X component may be the scanning direction.

The measured data Dm (Dmt, Dmx, and Dmy) may be provided to the data processing part 300 through the internal bus or the wired/wireless network.

The measured data Dm (Dmt, Dmx, and Dmy) provided to the data processing part 300 may be initially provided to the sampling part 310.

If the measured data Dm provided to the data processing part 300 or the sampling part 310 includes only the unified measured data Dmt, the sampling part 310 may separately generate X-component measured data Dmx and Y-component measured data Dmy from the unified measured data Dmt. For example, the X-component measured data Dmx may be obtained by partially differentiating the unified measured data Dmt with respect to X, or by removing the Y-component errors Ry from the unified measured data Dmt. The Y-component measured data Dmy may be obtained by partially differentiating the unified measured data Dmt with respect to Y, or by removing the X-component errors Rx from the unified measured data Dmt. As described above, if both the X-component measured data Dmx and the Y-component measured data Dmy are provided by the measuring part 200, the measuring part 200 may separately generate the X-component measured data Dmx and the Y-component measured data Dmy from the unified measured data Dmt.

The processes described below may be independently repeated using the unified measured data Dmt, the X-component measured data Dmx, and Y-component measured data Dmy as needed. For brevity, assume that embodiments perform a series of processes irrespective of an X component or a Y component without separating a series of processes performed on the X component from a series of processes performed on the Y component. Accordingly, even if described only once in a present embodiment, processes described using each of the X-component measured data Dmx or the Y-component measured data Dmy may be independently or repeatedly performed to independently generate various unified data, X-component data, and Y-component data. As described above, the measured data Dm (Dmt, Dmx, Dmy) may include measured errors R (Rt, Rx, Ry), and a process of processing errors R (Rt, Rx, Ry) to generate various data will be described below.

Referring to FIGS. 2A, 6, and 7A through 7C, a processing method may include removing outliers from the measured data Dm (Dmt, Dmx, and Dmy) to generate sampled data Ds (Dst, Dsx, and Dsy) (S40). The outliers may refer to measured shot areas SAm having errors R (Rt, Rx, and Ry) that exceed a tolerance or have abnormal numerical values. Accordingly, the generation of the sampled data Ds (Dst, Dsx, and Dsy) may include extracting and removing or ignoring the measured shot areas SAm having errors R (Rt, Rx, and Ry) which exceed the tolerance or have abnormal numerical values from the measured data Dm (Dmt, Dmx, Dmy), and providing measured shot areas SAm having errors R (Rt, Rx, and Ry), which have normal numerical values or are within the tolerance, as a wafer map or a table.

The sampled data Ds (Dst, Dsx, Dsy) may also include X-component sampled data Dsx that includes only X-component normal errors Rx, Y-component sampled data Dsy that includes only Y-component normal errors Ry, and unified sampled data Dst that includes both the X-component normal errors Rx and the Y-component normal errors Ry. The generation of the sampled data Ds (Dst, Dsx, and Dsy) may include the processes described below.

Referring to FIG. 2B, generating the sampled data Ds (Dst, Dsx, Dsy) may include selecting one measured shot area SA for determination as an outlier from the provided measured data Dm (Dmt, Dmx, Dmy), and selecting adjacent measured shot areas SAp1 to SAp4 of the selected measured shot areas SAs (S41). The adjacent measured shot areas SAp1 to SAp4 may include all measured shot areas SAm except the selected measured shot area SAs, or include adjacent measured shot areas SAp1 to SAp4 located within a predetermined criterial distance d. The criterial distance d may refer to the radius of a circle whose center is located in the selected measured shot area SA. As the criterial distance d increases in value, the number of adjacent measured shot areas SAp1 to SAp4 included in a circular area may increase, which can complicate a calculation process but improve a precision of the calculated value. As the criterial distance d is decreased in value, the number of adjacent measured shot areas SAp1 to SAp4 included in a circular area may decrease, which may simplify a calculation process, but a reduces a precision of the calculated value. In addition, as the criterial distance d increases, the influence of the adjacent measured shot areas SAp1 to SAp4 on the selected measured shot area SAs may be reduced. According to embodiments, to simplify the calculation process and reduce calculation time, an appropriate arbitrary criterial distance d may be set to choose only the adjacent measured shot areas SAp1 to SAp4 that may affect one another. According to other embodiments, there may be no criterial distance d, and all the measured shot areas SAm of the wafer W may be chosen to generate sampled data Ds (Dst, Dsx, Dsy).

Figure 6:
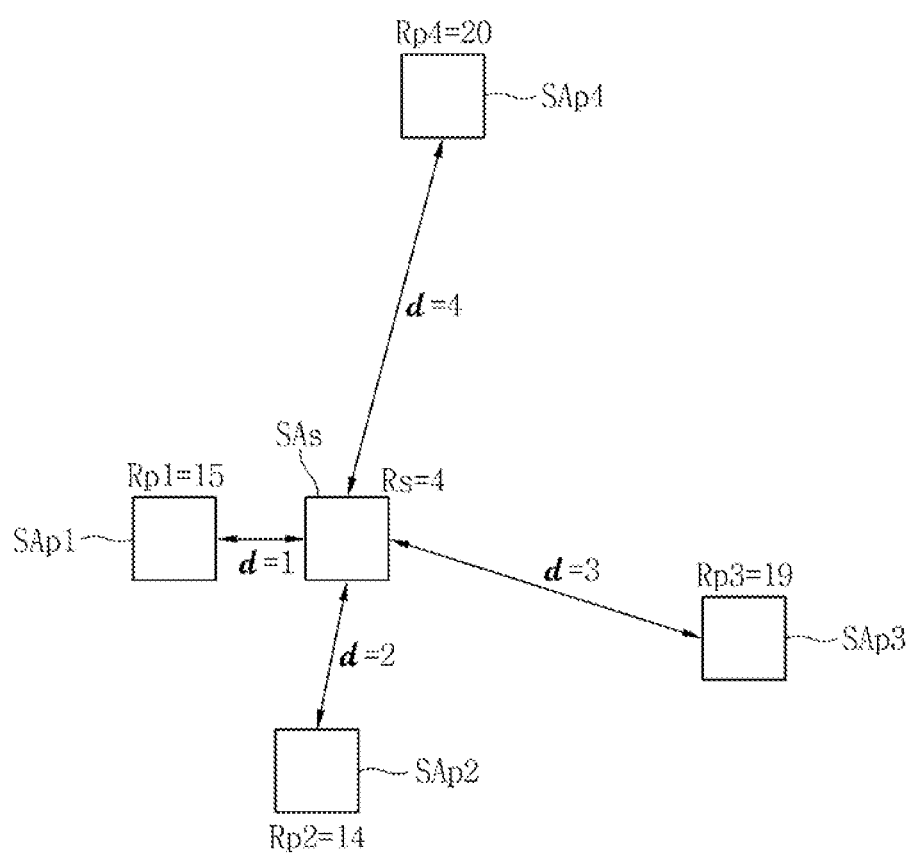

Referring to FIG. 6, for brevity, non-limiting embodiments may assume that a selected measured shot area SAs and four adjacent measured shot areas SAp1~SAp4 are selected. For example, non-limiting embodiments may assume that the selected measured shot area SAs has an error Rs=4, that a first adjacent measured shot area SAp1 at a distance d=1 from the selected measured shot area SAs has an error Rp1=15, that a second adjacent measured shot area SAp2 at a distance d=2 from the selected measured shot area SAs has an error Rp2=14, that a third adjacent measured shot area SAp3 at a distance d=3 from the selected measured shot area SAs has an error Rp3=19, and that a fourth adjacent measured shot area SAp4 at a distance d=4 from the selected measured shot area SAs has an error Rp4=20.

Referring back to FIG. 2B, generating the sampled data Ds (Dst, Dsx, Dsy) may include calculating a weighted mean $WA_S$ of the selected measured shot area SAs (S42). For example, the weighted mean $WA_S$ of the selected measured shot area SAs may be calculated using EQ. (5):

$$WA_S = \frac{\sum_{i=1}^{n}(R_i/d_i)}{\sum_{i=1}^{n}(1/d_i)}, \tag{5}$$

wherein $WA_S$ denotes the weighted mean of the selected measured shot area, l denotes adjacent measured shot areas, n denotes the total number of the adjacent measured shot areas, d denotes a distance between the selected measured shot area and each of the adjacent measured shot areas, and R denotes errors of each of the adjacent measured shot areas.

Referring back to FIG. 6 and EQ. (5), the weighted mean $WA_S$ of the selected measured shot area SAs may be calculated by: $\{(15/1+14/2+19/3+20/4)/(1/1+1/2+1/3+1/4)\}=16$. By repetitively performing the above-described process, weighted means WA of errors R (Rt, Rx, Ry) of all the measured shot areas SAm may be calculated. Conceptually, the calculation of the weighted mean $WA_S$ of the selected measured shot area SAs may refer to the estimation and calculation of the estimated error Rs of the selected measured shot area SAs with respect to the errors Rp of the adjacent measured shot areas SAp1 to SAp4. For example, considering the errors Rp1 to Rp4 of the adjacent measured shot areas SAp1 to SAp4, if the error Rs of the selected measured shot area SAs shown in FIG. 6 is about 16, errors Rp (Rp1 to Rp4) of the measured shot areas SAs (SAp1 to SAp4) may be continuous and linear.

Referring to FIG. 2B, generating the sampled data Ds (Dst, Dsx, Dsy) may include calculating a difference Diffs between the weighted mean $WA_S$ of the selected measured shot area SAs and the estimated and calculated error Rs of the selected measured shot area SAs: Diffs=$WA_S$–Rs. (S43). In the example of FIG. 6, since the error Rs of the selected measured shot area SAs is 4, the difference Diffs between the weighted mean $WA_S$ and error Rs of the selected measured shot area SAs may be calculated by: 16–4=12. Step S43 may be repetitively performed on the measured shot areas SAm, to determine whether or not the shot areas SAm are outliers. By repeating the above-described processes, errors Rm, weighted means $WA_m$, and differences Diffm between the errors Rm and the weighted means $WA_m$ of all the measured shot areas SAm may be calculated to determine which, if any, shot areas SAm are outliers.

Referring to FIG. 2B, generating the sampled data Ds (Dst, Dsx, Dsy) may include calculating a difference mean Mean(Diffm) of the differences Diffm between the weighted means $WA_m$ and errors Rm of all the measured shot areas SAm using EQ. (6) (S44):

$$\text{Mean}(Diff_m) = \frac{\sum_{i=1}^{n}(WA_i - R_i)}{n}, \quad (6)$$

wherein Mean(Diffm) denotes the difference mean of the differences Diffm between the weighted means and errors of the respective measured shot areas, and n denotes the total number of the measured shot areas.

Exemplary embodiments may assume that the difference mean Mean(Diffm) of the differences Diffm between the weighted means $WA_m$ and errors Rm of all the measured shot areas SAm is zero (0). Since each of the weighted means $WA_m$ and the errors Rm may have a positive (+) value or a negative (−) value, the difference mean Mean(Diffm) of the differences Diffm between the weighted means $WA_m$ and the errors Rm may be a positive number, a negative number, or zero (0).

Referring to FIG. 2B, generating the sampled data Ds (Dst, Dsx, Dsy) may include calculating a standard deviation Stdev(Diffm) of the differences Diffm between the weighted means $WA_m$ and errors Rm of all the measured shot areas SAm (S45). In an exemplary embodiment, it may be assumed that the standard deviation Stdev(Diffm) of the differences Diffm between the weighted means $WA_m$ and errors Rm of all the measured shot areas SAm is 3.

Referring to FIG. 2B, generating the sampled data Ds (Dst, Dsx, Dsy) may include calculating outlier factors Zs in the respective measured shot areas SAm (S46). The calculation of the outlier factors Zs may be performed using EQ (7). That is, the calculation of the outlier factors Zs may include subtracting difference mean Mean(Diff$_m$) between weighted means $WA_m$ and errors Rm of all the measured shot areas SAm from differences Diffs between weighted means $WA_S$ and errors Rs of selected measured shot areas SAs, and dividing the resulting values of the subtraction by a standard deviation Stdev(Diff$_m$) of differences between the weighted means $WA_m$ and the errors Rm of all the measured shot areas SAm:

$$Z_S = \{Diff_S - \text{Mean}(Diff_m)\}/\text{Stdev}(Diff_m) \quad (7),$$

wherein Zs denotes the outlier factor of each of the measured shot areas, Diffs denotes a difference between the weighted mean and error of each of the measured shot areas, Mean (Diffm) denotes a difference mean of differences between the weighted means and errors of all the measured shot areas, and Stdev(Diffm) denotes the standard deviation of the differences between the weighted means and errors of all the measured shot areas.

In a present embodiment, since the difference Diffs between the weighted mean $WA_S$ and error Rs of the selected measured shot area SAs shown in FIG. 6 is 12, the difference mean Mean(Diffm) of the differences Diffm between the weighted means $WA_m$ and errors Rm of all the measured shot areas SAm is zero (0), and the standard deviation Stdev(Diffm) of the differences Diffm between the weighted means $WA_m$ and errors Rm of all the measured shot areas SAm is 3, the outlier factor Zs of the selected measured shot area SAs may be calculated by: (12−0)/3=4.

As an example, Table 2 shows the errors Rm and weighted means $WA_m$ of all the measured shot areas SAm, the differences Diffm between the weighted means $WA_m$ and errors Rm of the respective measured shot areas SAm, the difference mean Mean(Diffm) of the differences Diffm between the weighted means $WA_m$ and errors Rm of all the measured shot areas SAm, the standard deviation Stdev (Diffm) of the differences Diffm between the weighted means $WA_m$ and errors Rm of all the measured shot areas SAm, and outlier factors Zm. In Table 2, numerical values are represented by integers without units for brevity, and it is assumed that the total number of the measured shot areas SAm is 40.

TABLE 2

| Measured shot area No. | Error (Rm) | Weighted mean ($WA_m$) | Difference between weighted mean and error (Diffm) | Outlier factor (Zm) |
|---|---|---|---|---|
| SA1 | 4 | 16 | 12 | 4 |
| SA2 | 14 | 17 | 3 | 1 |
| SA3 | 10 | 16 | 6 | 2 |
| SA4 | 16 | 19 | 3 | 1 |
| SA5 | 24 | 15 | −9 | −3 |
| . . . | . . . | . . . | . . . | . . . |
| SA40 | 19 | 16 | −3 | −1 |

A difference mean (Mean(Diffm)) of differences Diffm between the weighted means $WA_m$ and errors Rm of all the measured shot areas SAm is 0.
A standard deviation (Stdev(Diffm)) of differences Diffm between weighted means $WA_m$ and errors Rm of all the measured shot areas SAm is 3.

Referring to FIG. 2B, the generation of the sampled data Ds (Dst, Dsx, Dsy) may include setting a criterial outlier factor Zc of each of the measured shot areas SAm (S47), determining which of the measured shot areas SAm are outliers based on the respective criterial outlier factors Zc (S48), and removing those measured shot areas SAm determined as outliers from the measured data Dm (Dmt, Dmx, Dmy) (S49). That is, the generation of the sampled data Ds (Dst, Dsx, Dsy) may include removing measured shot areas SAm determined as outliers from the measured data Dm (Dmt, Dmx, Dmy), ignoring the errors Rm of measured shot areas SAm determined as outliers, or regarding measured shot areas SAm determined as outliers as unmeasured shot areas SAn.

Setting the criterial outlier factor Zc of each of the measured shot areas SAm (S47) may be performed using a criteria error based on error magnitudes |Rm| of each of the measured shot areas SAm. For example, assuming that the criterial value of the errors |Rm| is 15, it may be determined whether or not measured shot areas SA4, SA5, . . . , and SA40 having errors |Rm| greater than the criteria error value of 15 are outliers by strictly setting actual criterial outlier factor Zc to be relatively low, and it may be determined whether or not measured shot areas SA1, SA2, SA3, . . . having errors |Rm| less than the criteria error value of 15 are outliers by loosely setting actual criterial outlier factor Zc to be relatively high. Specifically, the measured shot areas SA4, SA5, . . . , and SA40 having errors |Rm| greater than the criteria error value of 15 are regarded as outlier area candidates. The determining whether or not the outlier area candidates are actual outliers may include strictly setting a relatively low criterial outlier factor Zc of, for example, 3, and comparing an absolute value of the calculated outlier factor |Zm| of each of the outlier area candidates of the measured shot areas SAm to the criterial outlier factor Zc. If |Zm|>Zc (=3), then the outlier area candidate is an actual outlier, otherwise the outlier area candidate is an inlier if |Zm|<Zc (=3). In addition, the measured shot areas SA1, SA2, SA3, . . . having errors |Rm| less than the criteria error value of 15 are regarded as inlier area candidates. The determination of whether or not the inlier area candidates are outliers may include loosely setting a relatively high criterial outlier factor Zc of, for example, 5, and comparing an absolute value of the calculated outlier factor |Zm| of each of the inlier area candidates of the measured shot areas SAm to the criterial outlier factor Zc. If |Zm|>Zc (~5), then the inlier area candidate is an outlier, otherwise the inlier area candidate is an actual inlier if |Zm|<Zc (=5) (S48). That is, the determination of the measured shot areas SAm as outliers may include applying a relatively strict outlier determination criterion to the outlier area candidates having errors |Rm| greater than the criteria error value, and applying a relatively loose outlier determination criterion to the inlier area candidates having errors |Rm| less than the criteria error value.

By repeating steps S41 to S48, all the outliers may be removed so that sampled data Ds (Dst, Dsx, Dsy) having only inliers may be generated. The sampled data Ds (Dst, Dsx, Dsy) may be a wafer map or a table. As described above, the generation of the sampled data Ds (Dst, Dsx, Dsy) may include independently performing the above-described processes on the X-component measured data Dmx and the Y-component measured data Dmy. Accordingly, the sampled data Ds (Dst, Dsx, Dsy) may include X-component sampled data Dsx, Y-component sampled data Dsy, and/or unified sampled data Dst.

Figure 7A:
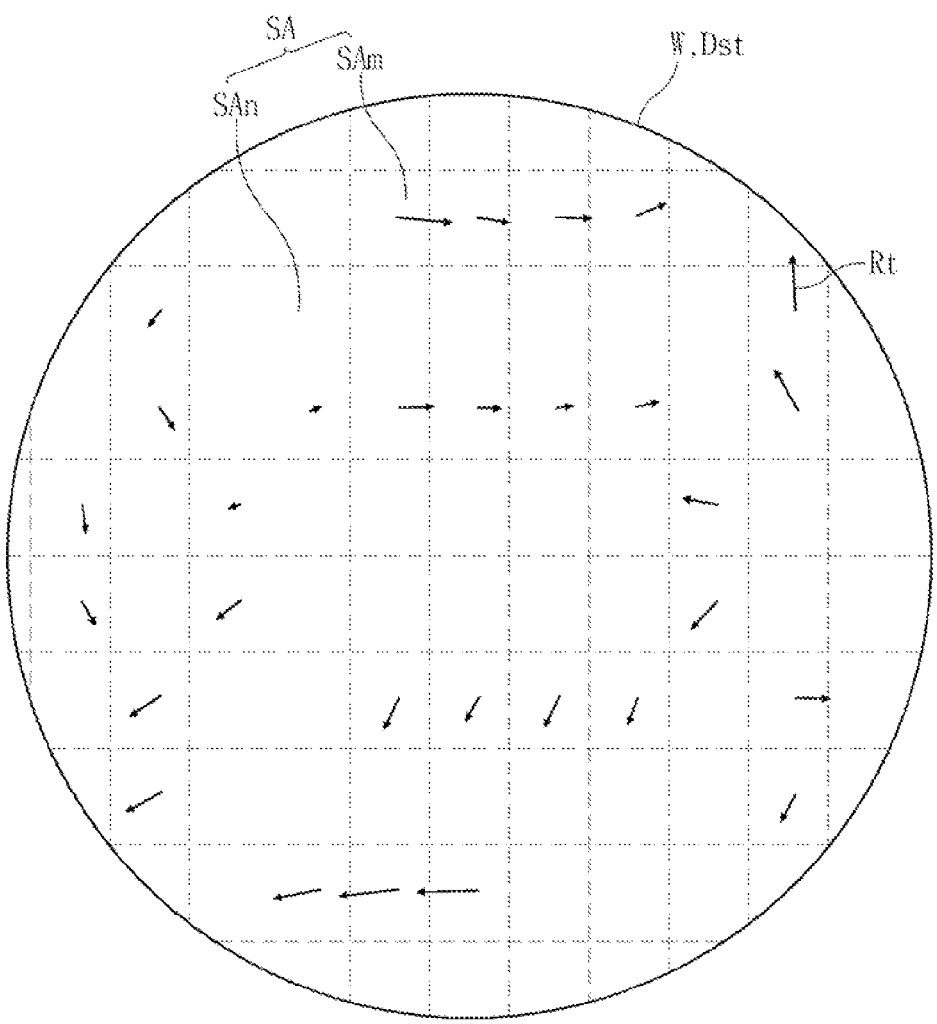
Figure 7B:
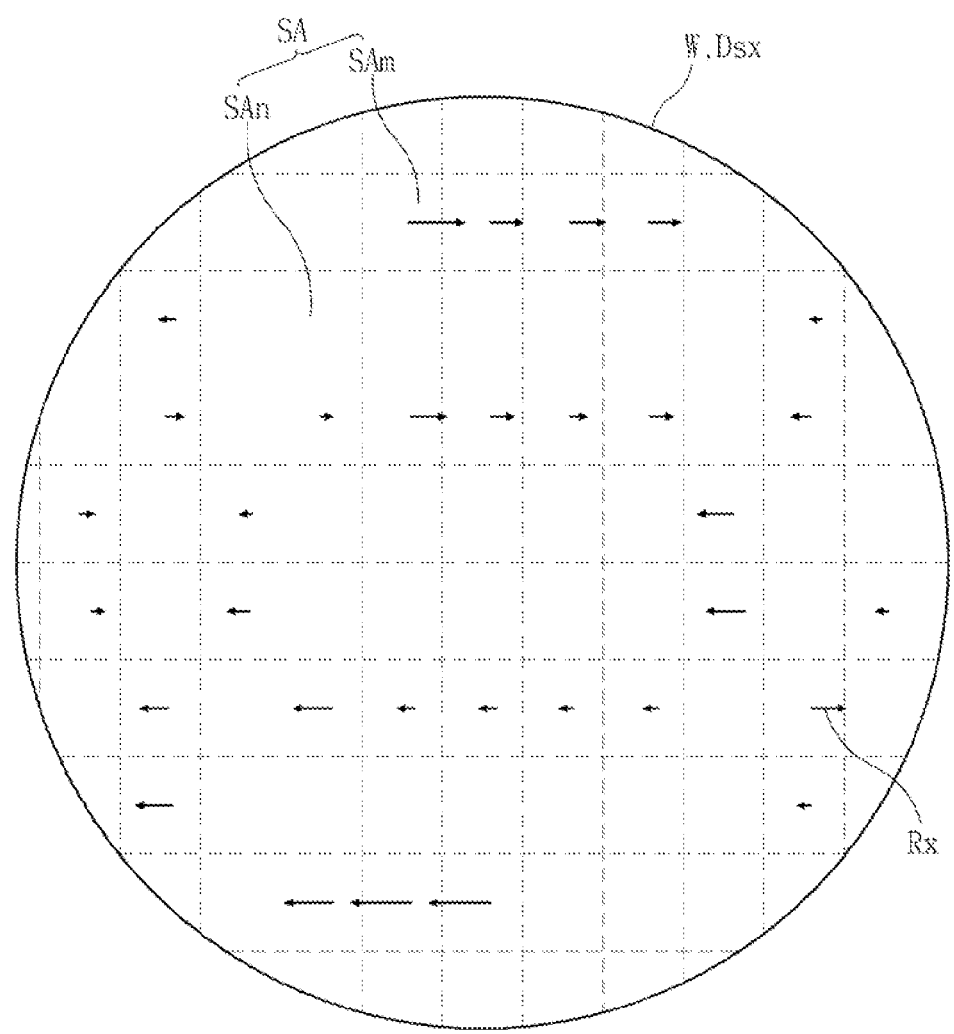
Figure 7C:
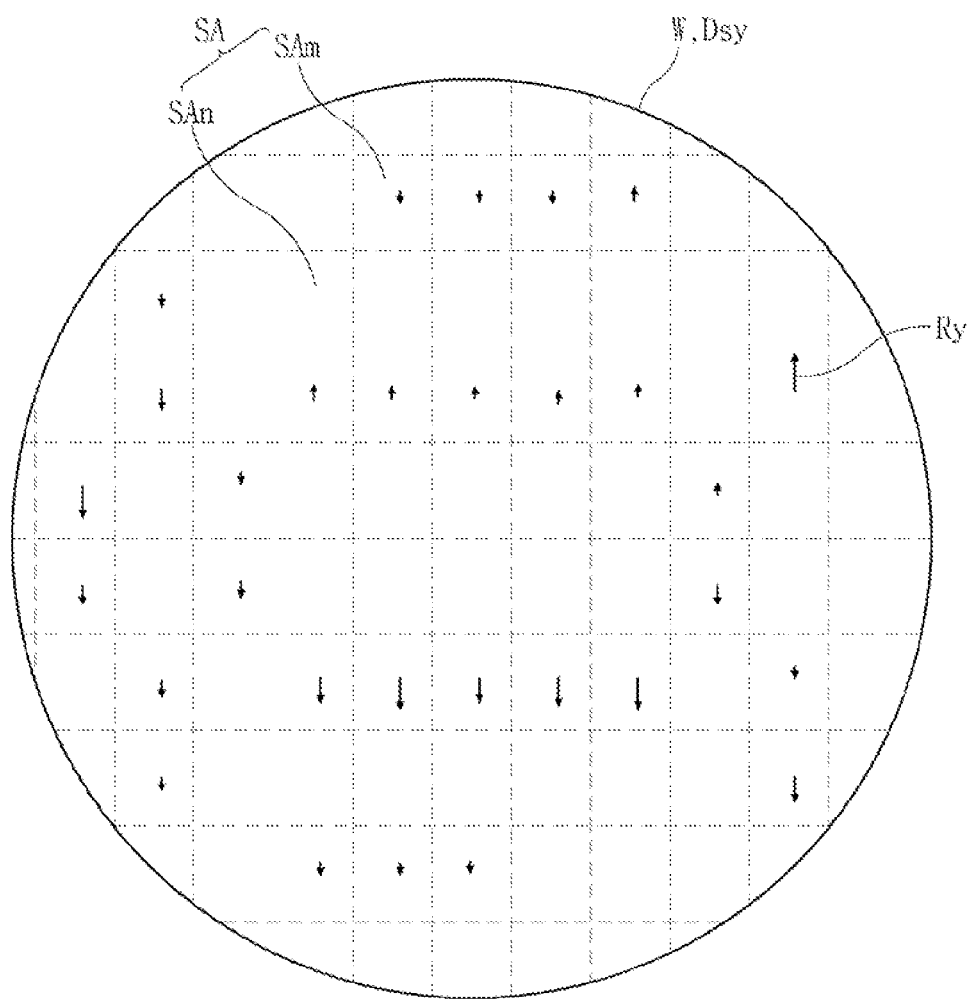

FIGS. 7A through 7C show sampled data Ds (Dst, Dsx, Dsy) that includes only inliers, from which outliers are removed. For example, FIG. 7A shows unified sampled data Dst, FIG. 7B shows X-component sampled data Dsx, and FIG. 7C shows Y-component sampled data Dsy. The sampled data Ds (Dst, Dsx, Dsy) may be provided to the estimating part 320.

Referring to FIGS. 2A, 8A through 8C, and 9, a method of calibrating errors according to embodiments of the inventive concept may include generating estimated data De (Det, Dex, Dey) (S50). For example, generating the estimated data De (Det, Dex, Dey) may include performing the following processes.

Referring to FIG. 2C, generating estimated data De (Det, Dex, Dey) may include measuring a similarity γ between normal measured shot areas SAm of the sampled data Ds (Dst, Dsx, Dsy). The measurement of the similarity γ may include calculating a variogram or a semi-variogram (S51). For example, the similarity γ between normal measured shot areas SAm may be calculated using EQ. (8):

$$\gamma(h) = \frac{1}{2n}\sum_{i=1}^{n}[R(x_i) - R(x_i + h)]^2, \tag{8}$$

wherein γ denotes a similarity, h denotes the range of distances between shot areas, n denotes the total number of shot areas disposed within the distance range, $R(x_i)$ denotes errors of a specific shot area, and $R(x_i+h)$ denotes errors of a shot area spaced apart from the specific shot area by h.

The similarity γ may refer to a degree of likeness between errors $R_i$ and $R_{i+h}$ of the measured shot areas $SA_X$ and $SA_{X+1}$ spaced a predetermined distance apart from each other. For example, if the errors $R_i$ and $R_{i+h}$ of the two shot areas $SA_X$ and $SA_{X+1}$ are the same, the similarity γ may be zero (0). As the difference between the errors $R_i$ and $R_{i+h}$ of the two shot areas $SA_X$ and $SA_{X+1}$ increases, the similarity γ may increase. If the distance h is set to 5, the calculation of the similarity γ may include applying a difference between the errors $R_i$ and $R_{i+h}$ of the two shot areas $SA_X$ and $SA_{X+1}$ spaced a distance of 5 apart from each other, to all the shot areas SA. The distance h may range between a minimum distance and a maximum distance. For example, the distance h may be determined to be in the range of "5 to 6". Accordingly, the total number n of the shot areas SA disposed within the distance h may be determined to be the total number of shot areas SA disposed within a range between the minimum distance and the maximum distance.

Referring to FIGS. 2C and 8A through 8D, generating the estimated data De (Det, Dex, Dey) may include selecting a shot area SAe whose errors R (Rt, Rx, Ry) will be estimated, and measured shot areas SApA to SApD disposed adjacent to the selected shot area SAe (S52), calculating weighting factors of the measured shot areas SApA to SApD disposed adjacent to the selected shot area SAe (S53), and calculating an estimation error Re of the selected shot area SAe, based on the weighting factors (S54). The selected shot area SAe may be an unmeasured shot area SAn or may be a measured shot area SAm that has been determined to be an outlier and has been removed.

Figure 8A:
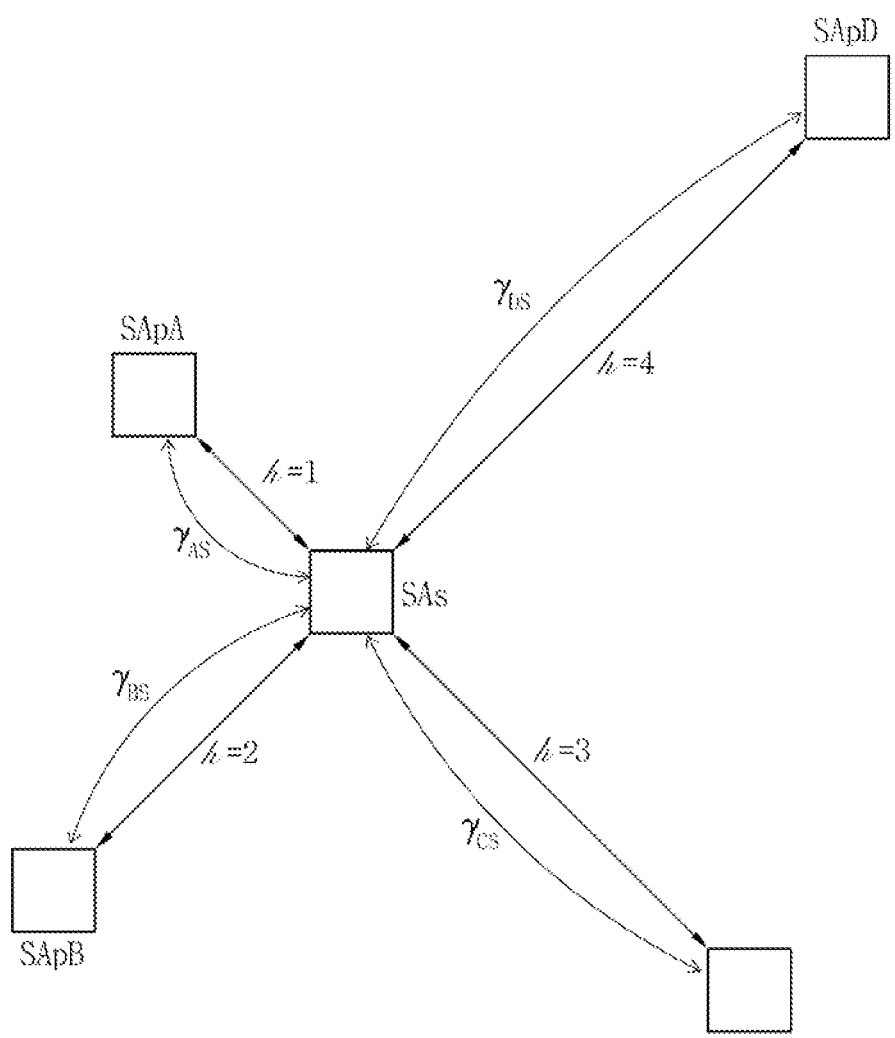
Figure 8B:
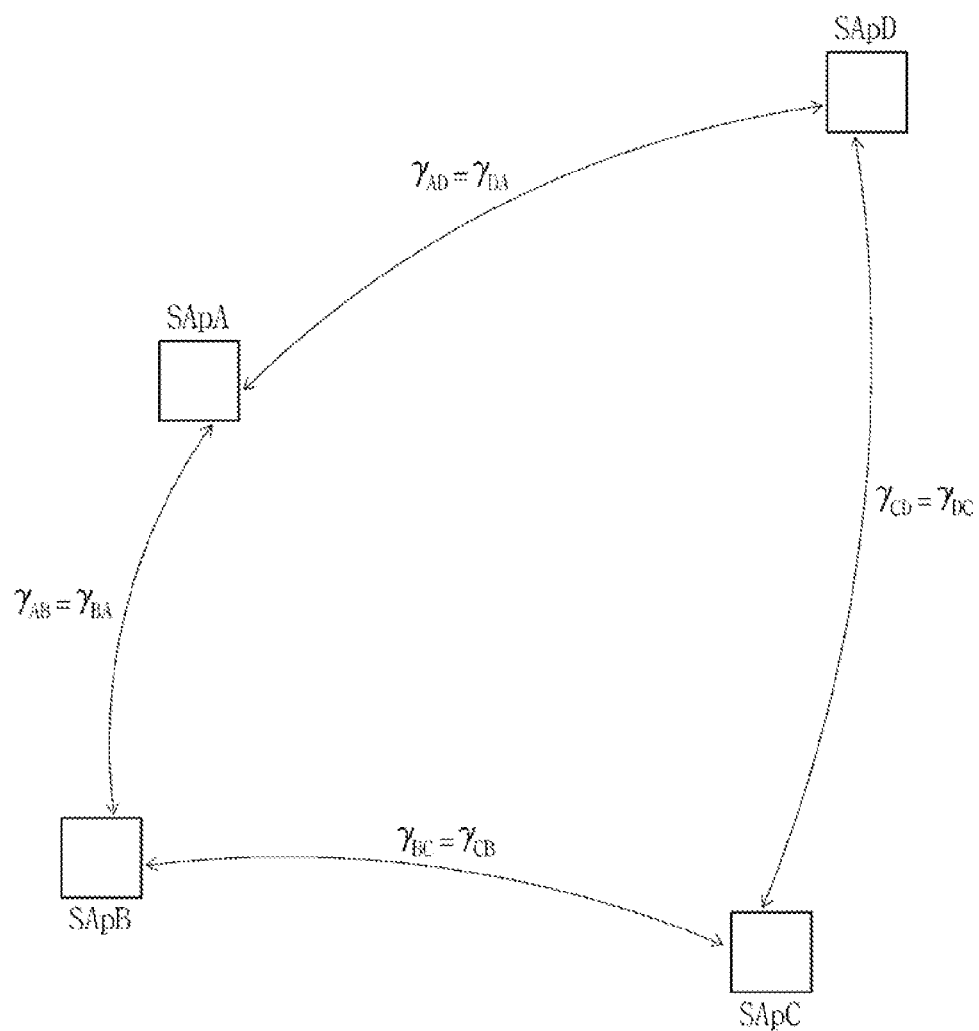
Figure 8C:
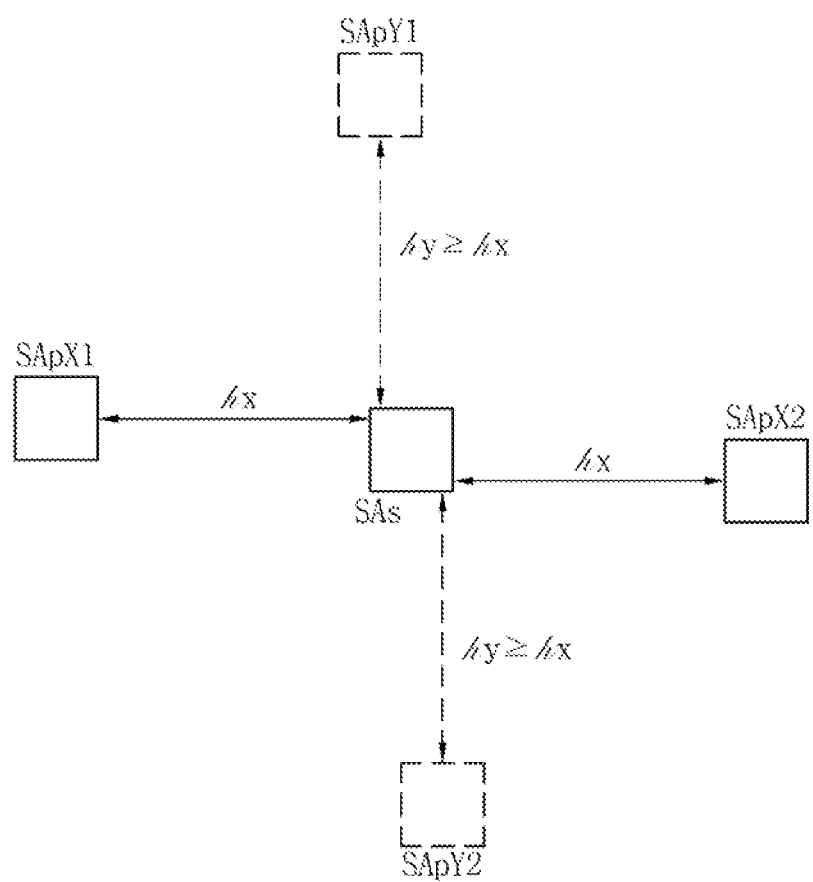

Referring to FIG. 8C, calculating the similarity γ may include calculating an X-component of the similarity $\gamma_X$. For example, calculating the similarity γ may include calculating the X-component of the similarity $\gamma_X$ by applying the distance range h between the measured shot areas SAm to the X direction in EQ. (8). Specifically, even if the distance between the adjacent shot areas SApY1 and SApY2 disposed in the Y direction is less than or equal to the distance between the adjacent shot areas SApX1 and SApX2 disposed in the X direction ($h_y \geq h_x$), the adjacent shot areas SApY1 and SApY2 disposed in the Y direction may be excluded to calculate the X-component similarity $\gamma_X$.

Figure 8D:
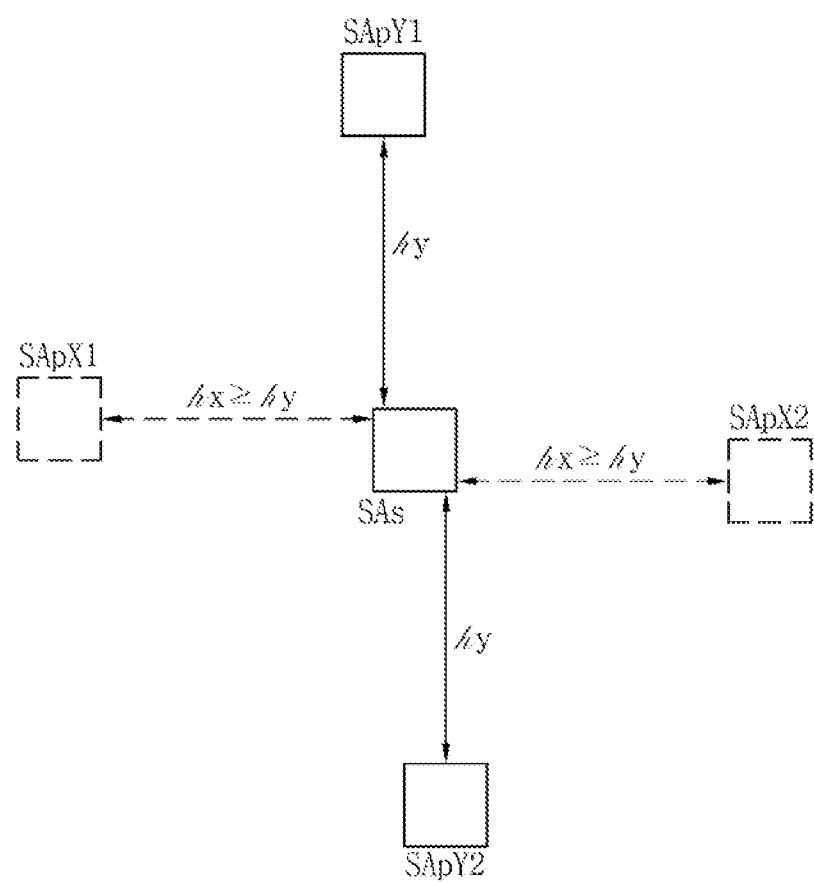

Referring to FIG. 8D, calculating the similarity $\gamma$ may include calculating a Y-component of the similarity $\gamma_Y$. For example, calculating the similarity $\gamma$ may include calculating the Y-component similarity $\gamma_Y$ by applying the distance range h between the measured shot areas SAm in the Y direction in EQ. (8). Specifically, even if the distance between the adjacent shot areas SApX1 and SApX2 disposed in the X direction is less than or equal to the distance between the adjacent shot areas SApY1 and SApY2 disposed in the Y direction ($h_X \geq h_Y$), the adjacent shot areas SApX1 and SApX2 disposed in the X direction may be excluded to calculate the Y-component similarity $\gamma_Y$.

A non-limiting exemplary for the calculation of various similarities $\gamma$, $\gamma_X$, and $\gamma_Y$ will be described in detail with reference to FIGS. 8E through 8G. For example, it may be assumed that there are nine shot areas A to I, and a distance range h for both directions X and Y ranges from 1 to 2 ($1 \leq h \leq 2$).

Figure 8E:
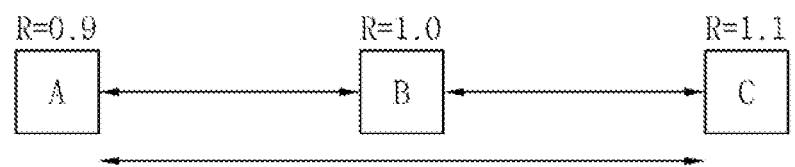
Figure 8E:
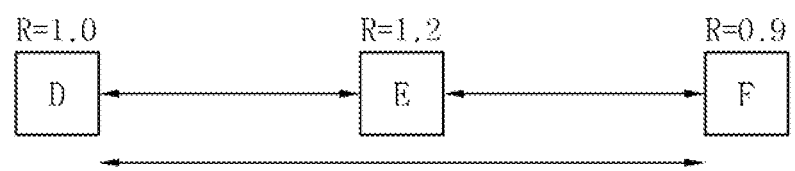
Figure 8E:
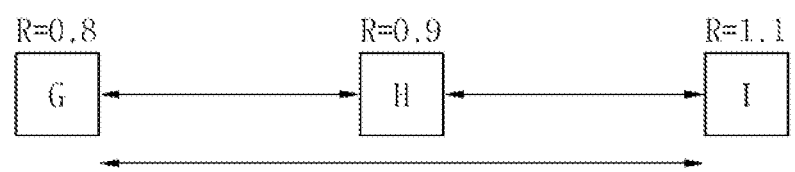

Referring to FIG. 8E, it may be assumed that shot areas A to I disposed within a distance range h in the X direction form nine combinations A-B, A-C, B-C, D-E, D-F, E-F, G-H, G-I, and H-I and have errors of 0.9, 1.0, 1.1, 1.0, 1.2, 0.9, 0.8, 0.9, and 1.1, respectively. If the respective shot areas A to I have errors $R_i$ and $R_{i+h}$ as shown in Table 3, the X-component similarity $\gamma_X$ may be calculated using EQ. (8). Since the distance range h ranges from 1 to 2, 1.5 is taken as a representative value. The X-component similarity $\gamma_X$ between the errors $R_i$ and $R_{i+h}$ of the shot areas A to I disposed within a distance h that have a representative value of 1.5 may be calculated to be 0.0189.

TABLE 3

| Distance range ($1 \leq h \leq 2$) | | | $R_i$ | $R_{i+h}$ | $(R_i - R_{i+h})^2$ |
|---|---|---|---|---|---|
| Combinations | A | B | 0.9 | 1.0 | 0.01 |
| of shot areas | A | C | 0.9 | 1.1 | 0.04 |
| adjacent in | B | C | 1.0 | 1.1 | 0.01 |
| X-direction | D | E | 1.0 | 1.2 | 0.04 |
| | D | F | 1.0 | 0.9 | 0.01 |
| | E | F | 1.2 | 0.9 | 0.09 |
| | G | H | 0.8 | 0.9 | 0.01 |
| | G | I | 0.8 | 1.1 | 0.09 |
| | H | I | 0.9 | 1.1 | 0.04 |
| SUM($\Sigma$) | | | | | 0.34 |
| $\gamma_X$ = SUM/2n = SUM/18 | | | | | 0.0189 |

Figure 8F:
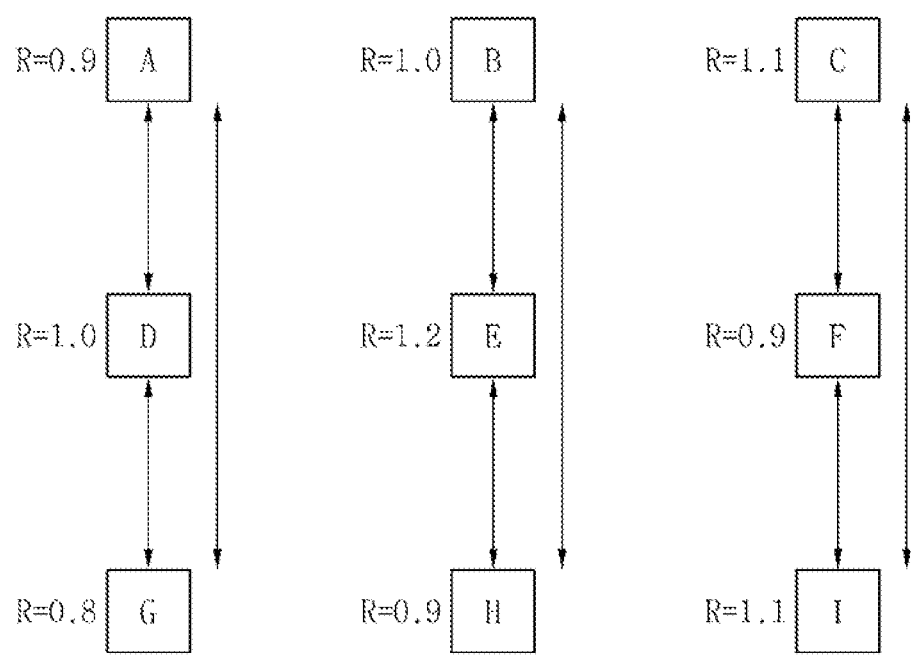

Referring to FIG. 8F, it may be assumed that shot areas A to I disposed within a distance range of 1 to 2 in the Y direction form nine combinations of A-D, A-G, D-G, B-E, B-H, E-H, C-F, C-I, and F-I and have errors of 0.9, 1.0, 1.1, 1.0, 1.2, 0.9, 0.8, 0.9, and 1.1, respectively. If the respective shot areas A to I have errors $R_i$ and $R_{i+h}$ as shown in Table 4, the Y-component similarity $\gamma_Y$ may be calculated using EQ (8). Since the distance range h ranges from 1 to 2, 1.5 is taken as a representative value. The Y-component similarity $\gamma_Y$ between the errors $R_i$ and $R_{i+h}$ of the shot areas A to I disposed within a distance h having a representative value of 1.5 may be calculated to be 0.0156.

TABLE 4

| Distance range ($1 \leq h \leq 2$) | | | $R_i$ | $R_{i+h}$ | $(R_i - R_{i+h})^2$ |
|---|---|---|---|---|---|
| Combinations | A | D | 0.9 | 1.0 | 0.01 |
| of shot areas | A | G | 0.9 | 0.8 | 0.01 |
| adjacent in | D | G | 1.0 | 0.8 | 0.04 |
| Y-direction | B | E | 1.0 | 1.2 | 0.04 |
| | B | H | 1.0 | 0.9 | 0.01 |
| | E | H | 1.2 | 0.9 | 0.09 |
| | C | F | 1.1 | 0.9 | 0.04 |
| | C | I | 1.1 | 1.1 | 0 |
| | F | I | 0.9 | 1.1 | 0.04 |
| SUM($\Sigma$) | | | | | 0.28 |
| $\gamma_Y$ = SUM/2n = SUM/18 | | | | | 0.0156 |

Figure 8G:
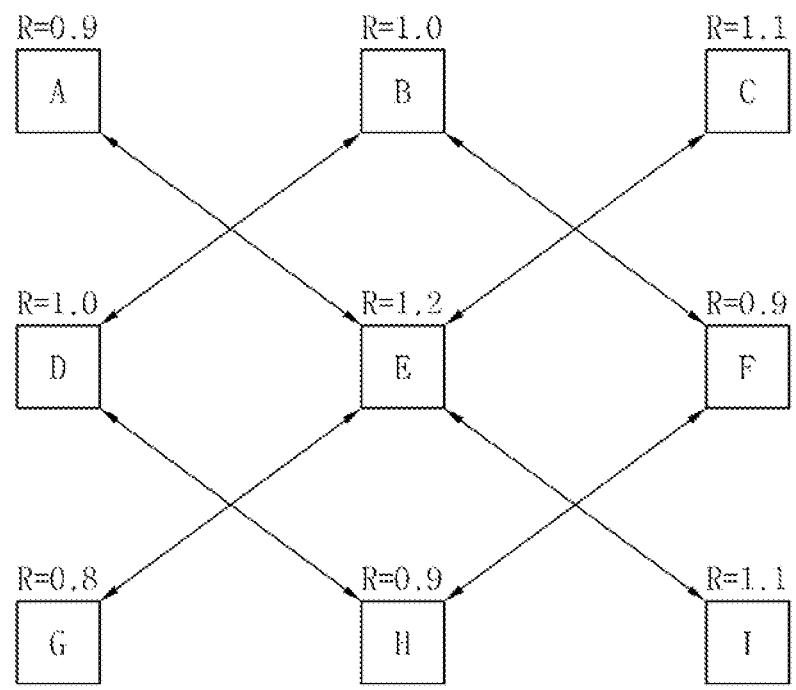

Referring to FIG. 8G, it may be assumed that shot areas A to I disposed within a distance range h of 1 to 2 in a direction other than the X and Y directions, for example, at an angle or in a diagonal direction, make eight combinations of A-E, B-D, B-F, C-E, D-H, E-G, E-I, and F-H and have errors of 0.9, 1.0, 1.1, 1.0, 1.2, 0.9, 0.8, 0.9, and 1.1, respectively. If the respective shot areas A to I have errors $R_i$ and $R_{i+h}$, as shown in Table 5, unified similarity $\gamma$ may be calculated based on the X-component similarity $\gamma_X$, the Y-component similarity $\gamma_Y$, and a diagonal similarity using EQ. (8). According to embodiments, diagonal similarities may be independently calculated.

TABLE 5

| Distance range ($1 \leq h \leq 2$) | | | $R_i$ | $R_{i+h}$ | $(R_i - R_{i+h})^2$ |
|---|---|---|---|---|---|
| Combinations | A | B | 0.9 | 1.0 | 0.01 |
| of shot areas | A | C | 0.9 | 1.1 | 0.04 |
| adjacent in | B | C | 1.0 | 1.1 | 0.01 |
| X-direction | D | E | 1.0 | 1.2 | 0.04 |
| | D | F | 1.0 | 0.9 | 0.01 |
| | E | F | 1.2 | 0.9 | 0.09 |
| | G | H | 0.8 | 0.9 | 0.01 |
| | G | I | 0.8 | 1.1 | 0.09 |
| | H | I | 0.9 | 1.1 | 0.04 |
| Combinations | A | D | 0.9 | 1.0 | 0.01 |
| of shot areas | A | G | 0.9 | 0.8 | 0.01 |
| adjacent in | D | G | 1.0 | 0.8 | 0.04 |
| Y-direction | B | E | 1.0 | 1.2 | 0.04 |
| | B | H | 1.0 | 0.9 | 0.01 |
| | E | H | 1.2 | 0.9 | 0.09 |
| | C | F | 1.1 | 0.9 | 0.04 |
| | C | I | 1.1 | 1.1 | 0 |
| | F | I | 0.9 | 1.1 | 0.04 |
| Combinations | A | E | 0.9 | 1.2 | 0.09 |
| of diagonally | B | D | 1.0 | 1.0 | 0 |
| adjacent shot | B | F | 1.0 | 0.9 | 0.01 |
| areas | C | E | 1.1 | 1.2 | 0.01 |
| | D | H | 1.0 | 0.9 | 0.01 |
| | E | G | 1.2 | 0.8 | 0.16 |
| | E | I | 1.2 | 1.1 | 0.01 |
| | F | H | 0.9 | 0.9 | 0 |
| SUM($\Sigma$) | | | | | 0.91 |
| $\gamma$ = SUM/2n = SUM/18 | | | | | 0.0175 |

Considering the X-component similarity $\gamma_X$, an X-component influence of the process equipment, for example, an influence of a stepping process of a photolithography system may be independently analyzed. In addition, considering the Y-component similarity $\gamma_Y$, a Y-component influence of the process equipment, for example, an influence of a scanning process of the photolithography system, may be independently analyzed.

Figure 9A:
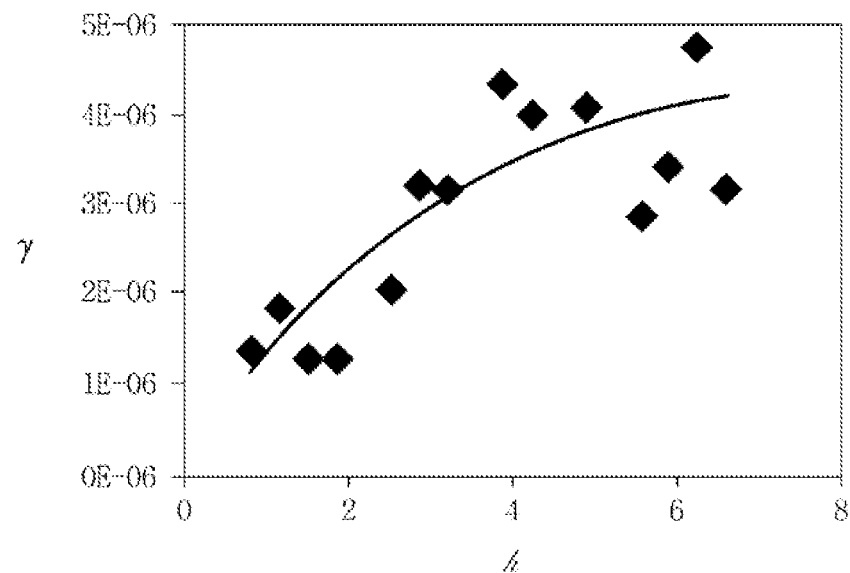
Figure 9B:
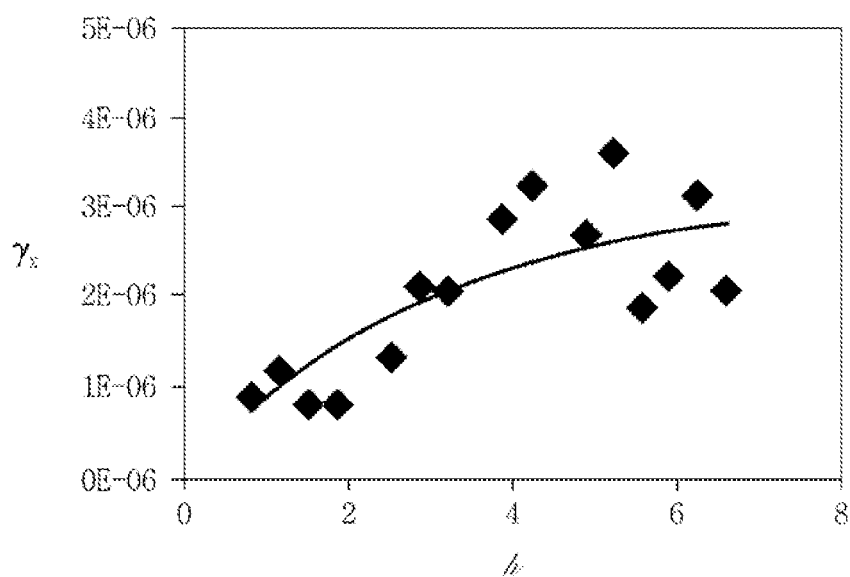
Figure 9C:
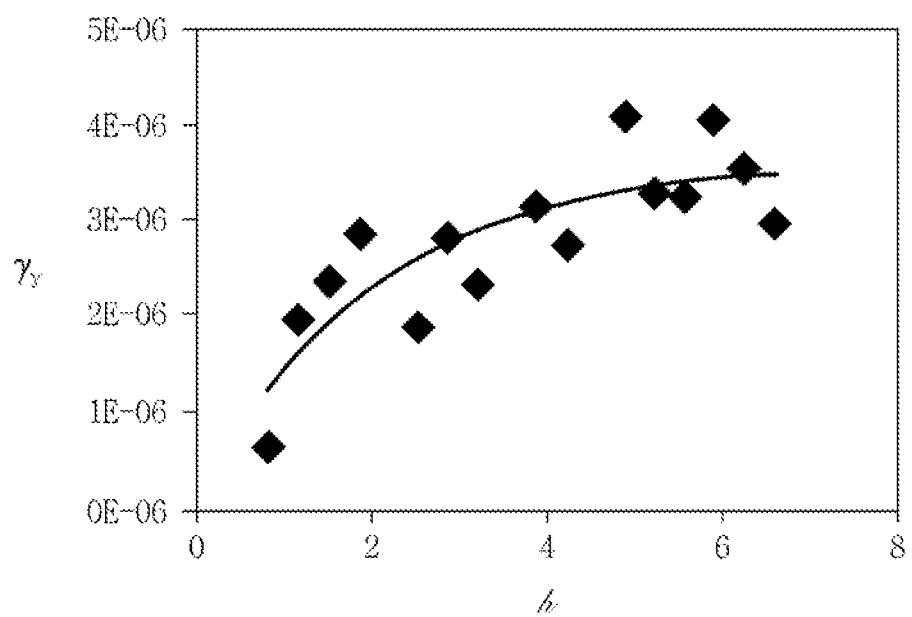

FIG. 9A is a graph showing measurements of similarity $\gamma$ of unified sampled data Dst, FIG. 9B is a graph showing measurements of similarity $\gamma_X$ of X-component sampled data Dsx, and FIG. 9C is a graph showing measurements of similarity $\gamma_Y$ of Y-component sampled data Dsy. Referring to FIGS. 9A through 9C, the similarities $\gamma$, $\gamma_X$, and $\gamma_Y$ may decrease as the distance h decreases, and increase as the distance h increases. As the distance h increases, results may become nonlinear (e.g., logarithmic) due to smaller differences between the similarities $\gamma$, $\gamma_X$, and $\gamma_Y$.

Next, referring to FIGS. 8A and 8B, calculating the estimated errors Re of the selected shot area SAe may include calculating correlations between the adjacent measured shot areas SApA to SApD using EQ. (9) to calculate weighting factors $\lambda_A$, $\lambda_B$, $\lambda_C$, $\lambda_D$. In EQ. (9), it may be assumed that there are four adjacent measured shot areas SApA to SApD, adjacent to the selected shot area SAe.

$$\begin{bmatrix} \lambda_A \\ \lambda_B \\ \lambda_C \\ \lambda_D \end{bmatrix} = \begin{bmatrix} \gamma_{AA} & \gamma_{AB} & \gamma_{AC} & \gamma_{AD} \\ \gamma_{BA} & \gamma_{BB} & \gamma_{BC} & \gamma_{BD} \\ \gamma_{CA} & \gamma_{CB} & \gamma_{CC} & \gamma_{CD} \\ \gamma_{DA} & \gamma_{DB} & \gamma_{DC} & \gamma_{DD} \end{bmatrix}^{-1} \begin{bmatrix} \gamma_{AS} \\ \gamma_{BS} \\ \gamma_{CS} \\ \gamma_{DS} \end{bmatrix}, \quad (9)$$

wherein $\lambda_A$, $\lambda_B$, $\lambda_C$, $\lambda_D$ are weighting factors for the adjacent measured shot areas, $\gamma_{AA}$, $\gamma_{AD}$, $\gamma_{BA}$, ..., $\gamma_{BD}$, $\gamma_{CA}$, ..., $\gamma_{CD}$, $\lambda_{DA}$, ..., $\gamma_{DD}$ are similarities between the shot areas, where $\gamma_{AA}=0$, $\gamma_{BB}=0$, $\gamma_{CC}=0$, $\gamma_{DD}=0$, and $\gamma_{AS}$, $\gamma_{BS}$, $\gamma_{CS}$, $\gamma_{DS}$ are similarities between the selected shot area and the respective adjacent measured shot areas.

Although embodiments have assumed for brevity that only four adjacent measured shot areas SApA to SApD are used to calculate the estimated error Re of the selected shot area SAe, in other embodiments, more or fewer measured shot areas SApN may be provided to calculate the estimated error Re of the selected shot area SAe. One of ordinary skill would easily understand that rows and/or columns in equal number to the adjacent measured shot areas SApN may be added to the determinant shown in EQ. (9). For example, denoting the total number of the adjacent measured shot areas SApN as N, EQ. (9) may be expanded to obtain EQ. (10):

$$\begin{bmatrix} \lambda_A \\ \lambda_B \\ \lambda_C \\ \lambda_D \\ \vdots \\ \lambda_N \end{bmatrix} = \begin{bmatrix} \gamma_{AA} & \gamma_{AB} & \gamma_{AC} & \gamma_{AD} & \cdots & \gamma_{AN} \\ \gamma_{BA} & \gamma_{BB} & \gamma_{BC} & \gamma_{BD} & \cdots & \gamma_{BN} \\ \gamma_{CA} & \gamma_{CB} & \gamma_{CC} & \gamma_{CD} & \cdots & \gamma_{CN} \\ \gamma_{DA} & \gamma_{DB} & \gamma_{DC} & \gamma_{DD} & \cdots & \gamma_{DN} \\ \vdots & \vdots & \vdots & \vdots & \vdots & \vdots \\ \gamma_{NA} & \gamma_{NB} & \gamma_{NC} & \gamma_{ND} & \cdots & \gamma_{NN} \end{bmatrix}^{-1} \begin{bmatrix} \gamma_{AS} \\ \gamma_{BS} \\ \gamma_{CS} \\ \gamma_{DS} \\ \vdots \\ \gamma_{NS} \end{bmatrix}. \quad (10)$$

Next, generating the estimated data De (Det, Dex, and Dey) may include calculating an estimated error Re of a selected shot area SAe. For example, the estimated error Re of the selected shot area SAe may be calculated using EQ. (11):

$$Re = \lambda_A R_A + \lambda_B R_B + \lambda_C R_C + \lambda_D R_D \quad (11),$$

wherein Re denotes an estimation error of a selected shot area, $\lambda_A$, $\lambda_B$, $\lambda_C$, $\lambda_D$ are weighting factors for respective adjacent measured shot areas, and $R_A$, $R_B$, $R_C$, and $R_D$ are measured errors of the adjacent measured shot areas.

That is, the estimated error Re of the selected shot area SAe may be calculated by adding the respective measured errors $R_A$ to $R_D$ of the adjacent measured shot areas SApA to SApD weighted respectively by the weighting factors $\lambda_A$, $\lambda_B$, $\lambda_C$, $\lambda_D$. In case that the total number of the adjacent measured shot areas SApN is N, EQ. (11) may be rewritten as EQ. (12):

$$Re = \sum_{i=1}^{N} \lambda_i R_i, \quad (12)$$

where i denotes an adjacent measured shot area.

For example, in EQS. (9) and (10), the X-component weighting factors $\lambda_X$ may be calculated based on the X-component similarity $\gamma_X$, and the X-component errors Rex may be estimated, and the Y-component weighting factors $\lambda_Y$ may be calculated based on the Y-component similarity $\gamma_Y$, and Y-component errors Rey may be estimated. Alternatively, a unified error Ret may be estimated based on both the X-component weighting factors $\lambda_X$ and the Y-component weighting factors $\lambda_Y$. The unified error Ret may be, for example, a mean of the estimated X-component error Rex and the estimated Y-component error Rey, or a median value based on the X-component weighting factors $\lambda_X$ and the Y-component weighting factors $\lambda_Y$.

X-component process results or measured results may have different trends from Y-component process results or measured results. As described above, if methods according to embodiments of the inventive concept are applied to, for example, a photolithography process, the X direction may be a stepping direction and the Y direction may be a scanning direction, so that an error element caused by stepping and an error element caused by scanning may be separately and independently estimated. Therefore, the estimated data De (Det, Dex, Dey) may inclusively or independently include X-component estimated results due to the X-component similarity $\gamma_X$ and Y-component estimated results due to the Y-component similarity $\gamma_Y$.

Figure 10A:
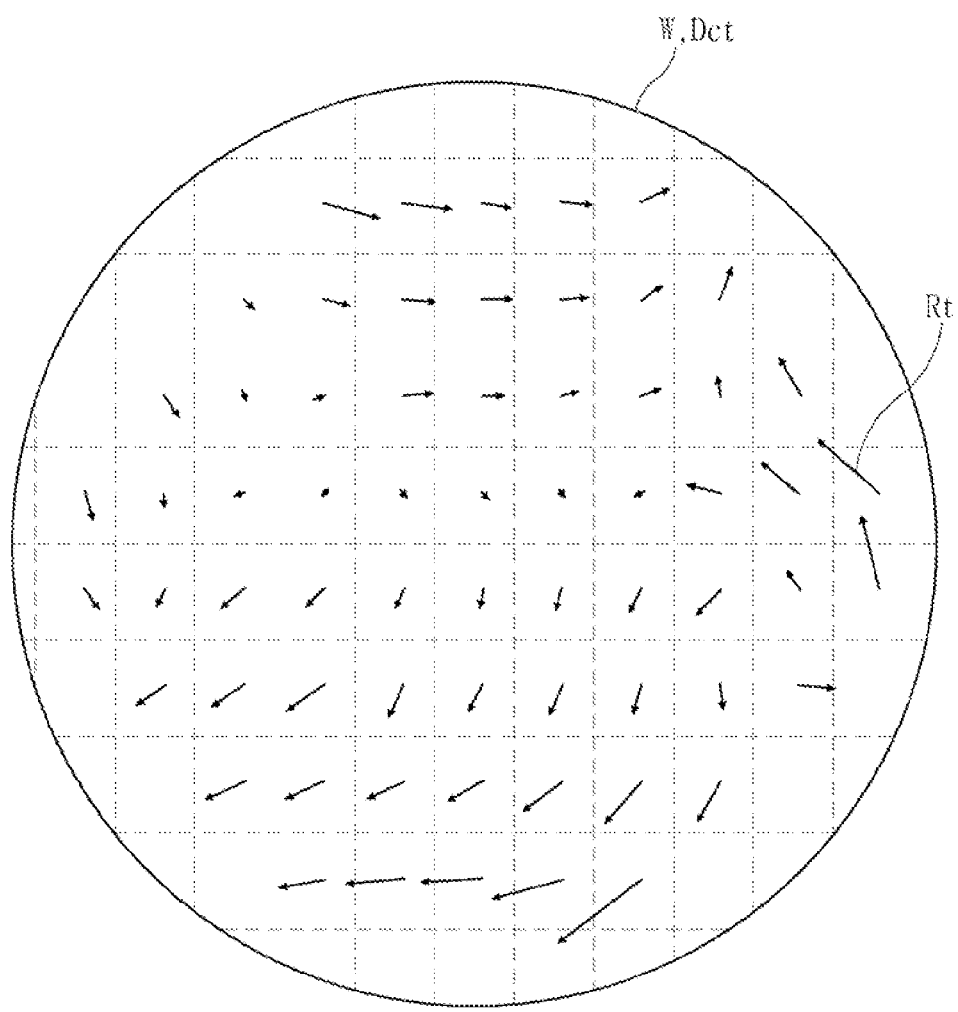
Figure 10B:
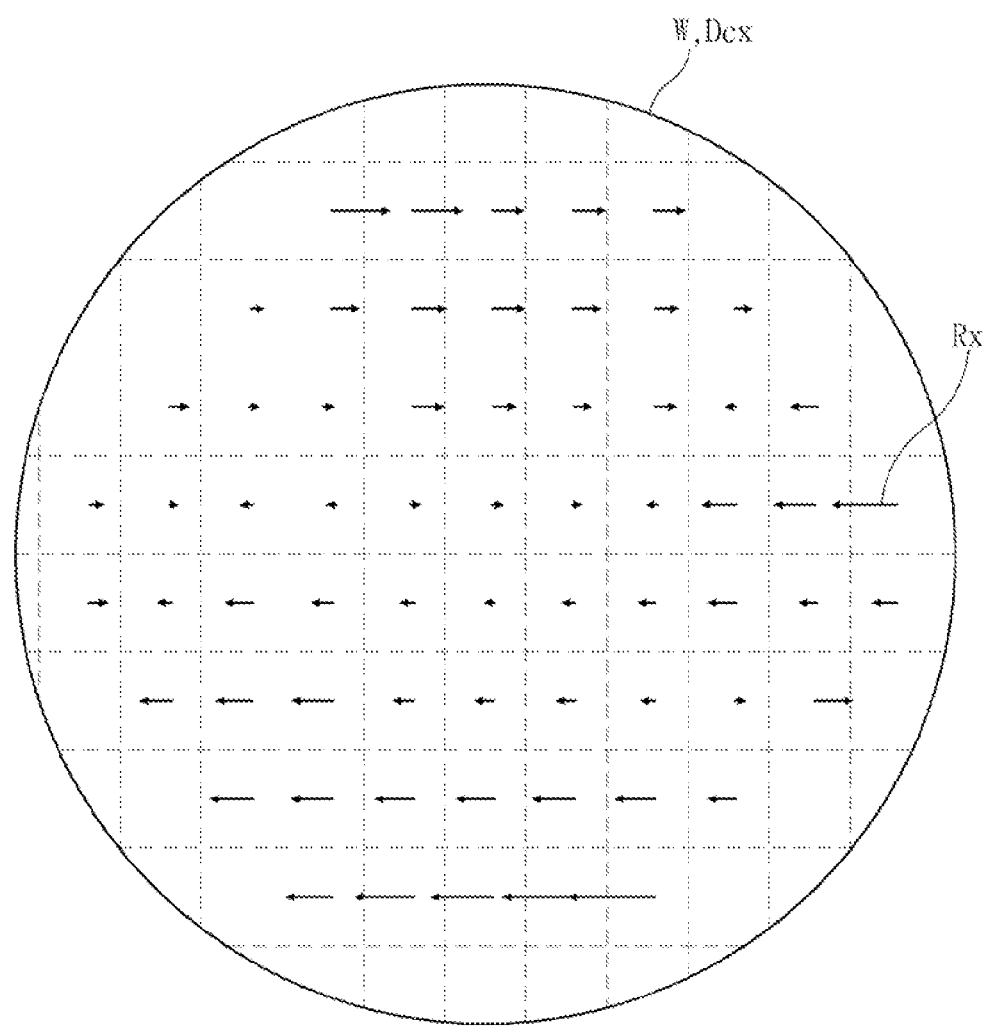
Figure 10C:
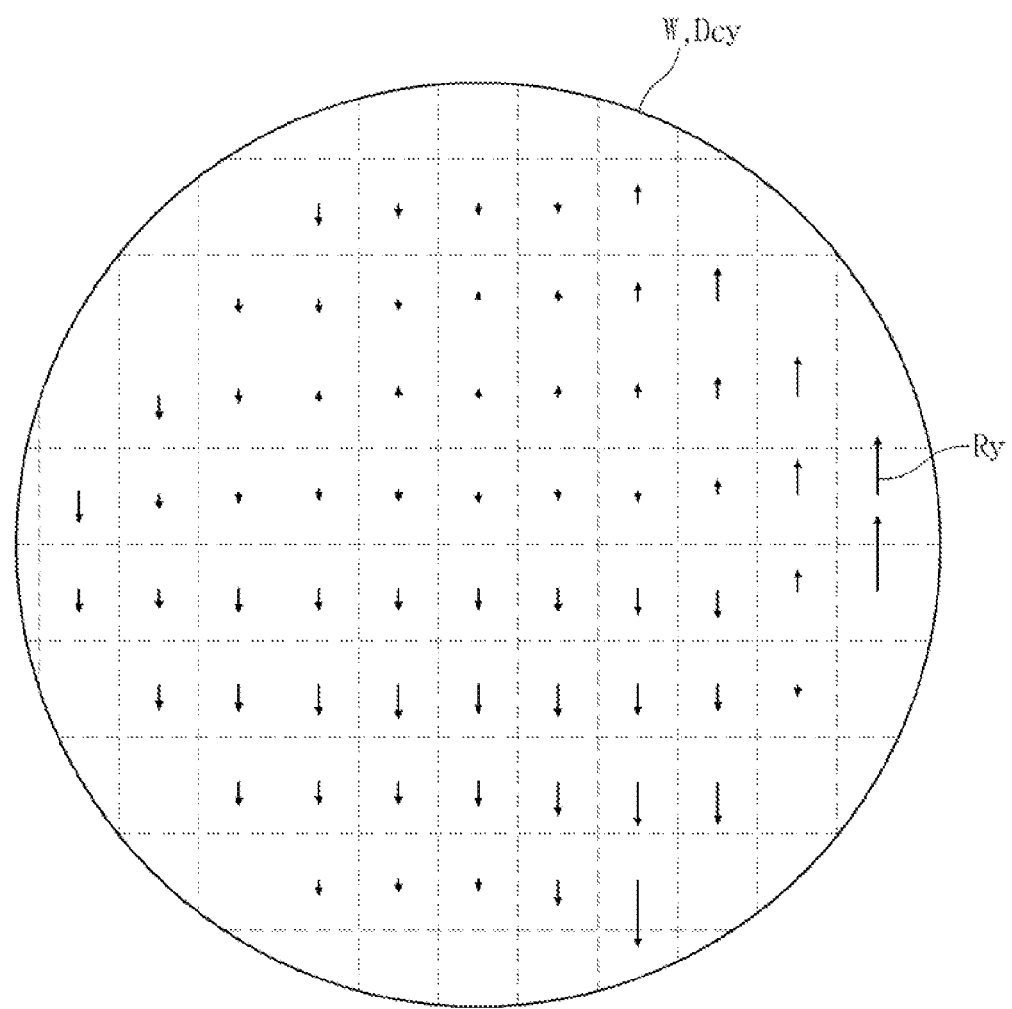

By performing processes according to embodiments of the inventive concept, all the shot areas SA may be measured, and the estimated data De (Det, Dex, Dey) having estimated errors Re (Rt, Rx, Ry) may be generated. Referring to FIGS. 10A and 10B, the estimated data De (Det, Dex, Dey) may be a wafer map. For example, the estimated data De (Det, Dex, Dey) may include X-component estimated data Dex including only X-component estimated errors Rx, Y-component estimated data Dey including only Y-component estimated errors Ry, and unified estimated data Det including both the X-component estimated errors Rx and the Y-component estimated errors Ry. Alternatively, referring to Table 6, the estimated data De (Det, Dex, Dey) may be a table.

TABLE 6

| Shot area | | Measured or estimated errors | |
|---|---|---|---|
| X position | Y position | X-direction | Y-direction |
| ... | ... | ... | ... |
| −5 | −4 | 4 | 2 |
| −5 | −3 | 5 | 6 |
| ... | ... | ... | ... |
| −2 | 1 | 8 | 5 |
| ... | ... | ... | ... |
| 1 | −2 | −6 | −5 |
| ... | ... | ... | ... |
| 5 | 4 | −6 | −6 |
| 5 | 5 | −4 | −4 |
| ... | ... | ... | ... |

The estimated data De (Det, Dex, and Dey) may be provided to the computing part 330.

As described above, the X-component errors may include errors obtained based on an X-component element (e.g., stepping), while the Y-component errors may include errors obtained based on a Y-component element (e.g., scanning). According to embodiments, both the X-component element and the Y-component element may be included in the errors.

Referring again to FIG. 2A, a method of calibrating errors according to embodiments of the inventive concept may include generating calibrated data Dc (Dct, Dcx, Dcy) (S60). Generating the calibrated data Dc (Dct, Dcx, Dcy) may include comparing estimated data De (Det, Dex, Dey) with initial data Di, and calibrating or offsetting target values of the initial data Di by differences between the estimated data De (Det, Dex, Dey) and the initial data Di. For example, if the initial data Di and estimated data De (Det, Dex, Dey) of the same shot area SA have target values of 10 and 5, respectively, the shot area SA based on the calibrated data Dc (Dct, Dcx, Dcy) may have a calibrated or offset target value by 5−10=−5. Referring to Table 7, the calibrated data De (Det, Dex, Dey) may be generated as a table.

TABLE 7

| Shot area | | Calibrated target values | |
|---|---|---|---|
| X position | Y position | $X_{cal}$ | $Y_{cal}$ |
| ... | ... | ... | ... |
| −5 | −4 | −4 | −5 |
| −5 | −3 | −3 | −3 |
| ... | ... | ... | ... |
| −2 | 1 | −2 | −3 |
| ... | ... | ... | ... |
| 1 | −2 | 3 | 2 |
| ... | ... | ... | ... |
| 5 | 4 | 2 | 3 |
| 5 | 5 | 4 | 3 |
| ... | ... | ... | ... |

Alternatively, the calibrated data Dc (Dct, Dcx, Dcy) may include a set of polynomial regression coefficients:

$$X_{cal}=k_{C1}+k_{C3}X+k_{C5}Y+k_{C7}X^2+k_{C9}XY+k_{C11}Y^2+k_{C13}X^3+k_{C15}X^2Y+k_{C17}XY^2+k_{C19}Y^3 \quad (13),$$

$$Y_{cal}=k_{C2}+k_{C4}Y+k_{C6}X+k_{C8}Y^2+k_{C10}XY+k_{C12}X^2+k_{C14}Y^3+k_{C16}XY^2+k_{C18}X^2Y+k_{C20}X^3 \quad (14),$$

wherein $X_{cal}$ denotes an X-component calibrated target value of each of shot areas, $Y_{cal}$ denotes a Y-component calibrated target value of each of shot areas, X and Y denote coordinates of each of the shot areas, and kc1 to kc20 are calibrated coefficients.

In addition, error constants $\epsilon_x$ and $\epsilon_y$ that represent equipment characteristics may be further included. That is, EQS. (13) and (14) may be expanded to obtain EQS. (15) and (16):

$$X_{cal}=k_{C1}+k_{C3}X+k_{C5}Y+k_{C7}X^2+k_{C9}XY+k_{C11}Y^2+k_{C13}X^3+k_{C15}X^2Y+k_{C17}XY^2+k_{C19}Y^3+\epsilon_x \quad (15),$$

$$Y_{cal}=k_{C2}+k_{C4}Y+k_{C6}X+k_{C8}Y^2+k_{C10}XY+k_{C12}X^2+k_{C14}Y^3+k_{C16}XY^2+k_{C18}X^2Y+k_{C20}X^3+\epsilon_y \quad (16),$$

wherein $\epsilon_x$ and $\epsilon_y$ are error constants of each piece of equipment.

A processing method according to embodiments of the inventive concept may include providing calibrated data Dc (Dct, Dcx, Dcy) to the processing part 100, and storing the calibrated data Dc (Dct, Dcx, Dcy) in the database 340. A method of calibrating errors according to embodiments of the inventive concept may include processing another wafer W in the processing part 100 based on the calibrated data Dc (Dct, Dcx, Dcy). All the above-described processes may be continuously repeated and performed.

Embodiments of the inventive concept provide a logical system configured to measure overlay errors by selecting some of shot areas of a wafer on which processes are performed, calculate outlier factors using weighted means of each of the shot areas and a mean and standard deviation of all measured overlay errors, and determine whether or not the shot areas are outliers based on outlier factors.

Embodiments of the inventive concept provide a logical system configured to estimate errors of all shot areas of a wafer based on measured data from which measured values of outliers are removed.

A processing method and system according to various embodiments of the inventive concept includes processing a wafer, selectively sampling and measuring the processing results, estimating all results based on the measured results, and processing the wafer by performing a calibrated or offset process based on the estimated results. According to embodiments of the inventive concept, the time taken to measure the processing results may be reduced, the measured results may be estimated more precisely, and processes may be appropriately calibrated or offset.

The foregoing is illustrative of embodiments and is not to be construed as limiting thereof. Although a few exemplary embodiments have been described, those skilled in the art will readily appreciate that many modifications are possible without materially departing from the novel teachings of exemplary embodiments. Accordingly, all such modifications are intended to be included within the scope of this inventive concept as defined in the claims.

What is claimed is:

1. A method for calibrating target values of a wafer being processed, comprising:
    processing a wafer having a plurality of shot areas using initial data, wherein the initial data includes initial target values that include one of a vector for a wafer map, a table with numerical values for respective shot areas, coordinates for each shot area, or a set of polynomial regression coefficients for calculating coordinates of each shot area;
    measuring errors for each of the plurality of shot areas;
    calculating an error similarity of at least some of the plurality of shot areas as a function of a separation distance between each pair of some of the shot areas;
    selecting a first shot area and a plurality of second shot areas adjacent to the first shot area;
    calculating weight values for the second shot areas based on the error similarities between each pair of second shot areas and the error similarities between the first shot area and each second shot area;
    calculating an estimated error of the first shot area based on the measured errors of the second shot areas and the weight values for the second shot areas;
    generating estimated data based on the estimated errors for each of the plurality of shot areas;
    calculating calibrated data from differences between the estimated data and the initial data; and
    processing another wafer having a plurality of shot areas using the calibrated data.

2. The method of claim 1, wherein calculating the error similarities comprises calculating $$\gamma(h) = \frac{1}{2n}\sum_{i=1}^{n}[R(x_i) - R(x_i + h)]^2,$$

wherein $\gamma$ is the error similarity, h is the separation distance between pairs of shot areas, n is the total number of shot areas disposed within the separation distance range, $R(x_i)$ and $R(x_i+h)$ are the measured errors of a specific shot area at position $x_i$, and another shot area spaced apart from the specific shot area by the distance range h.

3. The method of claim 2, wherein calculating the error similarities comprises independently calculating an X-component error similarity based on the measured errors of shot areas disposed adjacent to each other in an X direction, and a Y-component error similarity based on the measured errors of shot areas disposed adjacent to each other in a Y direction.

4. The method of claim 3, wherein calculating the error similarities is based on the X-component error similarity, the Y-component error similarity, and a diagonal error similarity based on the measured errors of shot areas disposed adjacent to each other in a diagonal direction.

5. The method of claim 2, wherein calculating the weight values comprises calculating $$\begin{bmatrix}\lambda_A\\ \lambda_B\\ \lambda_C\\ \lambda_D\\ \vdots\\ \lambda_N\end{bmatrix} = \begin{bmatrix}\gamma_{AA} & \gamma_{AB} & \gamma_{AC} & \gamma_{AD} & \cdots & \gamma_{AN}\\ \gamma_{BA} & \gamma_{BB} & \gamma_{BC} & \gamma_{BD} & \cdots & \gamma_{BN}\\ \gamma_{CA} & \gamma_{CB} & \gamma_{CC} & \gamma_{CD} & \cdots & \gamma_{CN}\\ \gamma_{DA} & \gamma_{DB} & \gamma_{DC} & \gamma_{DD} & \cdots & \gamma_{DN}\\ \vdots & \vdots & \vdots & \vdots & & \vdots\\ \gamma_{NA} & \gamma_{NB} & \gamma_{NC} & \gamma_{ND} & \cdots & \gamma_{NN}\end{bmatrix}^{-1}\begin{bmatrix}\gamma_{AS}\\ \gamma_{BS}\\ \gamma_{CS}\\ \gamma_{DS}\\ \vdots\\ \gamma_{NS}\end{bmatrix},$$

wherein $\lambda_A, \lambda_B, \lambda_C, \lambda_D, \ldots, \lambda_N$ are weighted values applied by second shot areas to the first shot area, $\gamma_{AA} \cdots \gamma_{AN}, \gamma_{BA} \cdots \gamma_{BN}, \gamma_{CA} \cdots \gamma_{CN}, \gamma_{DA} \cdots \gamma_{DN}, \ldots, \gamma_{NA} \cdots \gamma_{NN}$ are the error similarities between each pair of second shot areas where $\gamma_{AA}=\gamma_{BB}=\gamma_{CC}=\gamma_{DD}= \cdots \gamma_{NN}=0$, and $\gamma_{AS}, \gamma_{BS}, \gamma_{CS}, \gamma_{DS}, \ldots, \gamma_{NS}$ are the error similarities between the selected first shot area and the second shot areas.

6. The method of claim 5, wherein calculating the estimated errors comprises calculating:

$$R_e = \sum_{i=1}^{N}\lambda_i R_i,$$

wherein $R_e$ is the estimated error of the selected first shot area, N is the number of the first shot areas, $\lambda_i$ are the weight values for the second shot areas, and $R_i$ are the measured errors of the second shot areas.

7. The method of claim 1, further comprising:
determining whether or not the shot areas are outliers; and
deleting the measured errors of shot areas determined as the outliers from the measured data.

8. The method of claim 7, wherein the determining of whether or not the first shot areas are the outliers comprises:
calculating outlier factors of the plurality of shot areas;
setting a criterial outlier factor; and
determining as outliers those shot areas for which an absolute value of its outlier factor is greater than the criterial outlier factor.

9. The method of claim 8, wherein setting the criterial outlier factor comprises:
setting a criterial error;
setting the criterial outlier factor to be relatively small as compared to the calculated outlier factors for shot areas whose measured error is greater than the criterial error; and
setting the criterial outlier factor to be relatively large as compared to the calculated outlier factors for shot areas whose measured error is less than the criterial error.

10. The method of claim 8, wherein calculating the outlier factors of the plurality of shot areas comprises:
selecting one of the plurality of shot areas;
selecting at least two second shot areas disposed adjacent to the selected shot area;
calculating a weighted mean of the selected shot area based on the measured errors of the at least two adjacent second shot areas;
calculating a difference between the weighted mean of the selected shot area and the measured error of the selected shot area;
calculating a mean and a standard deviation of the difference between the weighted mean of the selected shot area and the measured error of the selected shot area for all the plurality of shot areas; and
dividing a value obtained by subtracting the mean from the difference between the weighted mean of the selected shot area and the measured errors by the standard deviation.

11. The method of claim 10, wherein calculating the weighted mean comprises calculating:

$$WA_S = \frac{\sum_{l=1}^{n}(R_l/d_l)}{\sum_{l=1}^{n}(1/d_l)},$$

wherein $WA_S$ is the weighted mean of the selected shot area, l denotes an adjacent shot area, n is a total number of adjacent shot areas, d is a distance between the selected shot area and each of the adjacent shot areas, and R is the measured error of each of the adjacent shot areas.

12. The method of claim 1, wherein the estimated data comprises:
X-component estimated data having X-component measured errors of the plurality of shot areas; and
Y-component estimated data having Y-component measured errors of the plurality of shot areas.

13. The method of claim 12, further comprising storing the calibrated data in a database,
wherein the calibrated data includes X-component calibrated target values and Y-component calibrated target values of all the plurality of shot areas.

14. The method of claim 1,
wherein the calibrated data includes a set of polynomial regression coefficients $k_{c1}$ to $k_{c20}$ calculated from:

$$X_{cal} = k_{C1} + k_{C3}X + k_{C5}Y + k_{C7}X^2 + k_{C9}XY + k_{C11}Y^2 + k_{C13}X^3 + k_{C15}X^2Y + k_{C17}XY^2 + k_{C19}Y^3 + \epsilon_x,$$

$$Y_{cal} = k_{C2} + k_{C4}Y + k_{C6}X + k_{C8}Y^2 + k_{C10}XY + k_{C12}X^2 + k_{C14}Y^3 + k_{C16}XY^2 + k_{C18}X^2Y + k_{C20}X^3 + \epsilon_y,$$

wherein $X_{cal}$ is an X-component calibrated target value of each of the shot areas, $Y_{cal}$ is a Y-component calibrated target value of each of the shot areas, X and Y are positions of each of the shot areas, $k_{c1}$ to $k_{c20}$ are calibrated coefficients, and $\epsilon_x$ and $\epsilon_y$ are error constants of each piece of equipment.

15. A method for calibrating target values of a wafer being processed, comprising:
    processing a first wafer having a plurality of shot areas based on initial data, wherein the initial data includes initial target values that include one of a vector for a wafer map, a table with numerical values for respective shot areas, coordinates for each shot area, or a set of polynomial regression coefficients for calculating coordinates of each shot area;
    generating measured data including measuring errors of the plurality of shot areas;
    determining as outliers those shot areas for which an absolute value of an outlier factor is greater than a criterial outlier factor;
    removing the measured errors of those shot areas determined as outliers from the measured data to generate sampled data;
    calculating estimated errors of the plurality of shot areas based on the measured errors of the plurality of shot areas;
    adding the estimated errors to the sampled data to generate estimated data;
    comparing the estimated data with the initial data to generate calibrated data; and
    processing a second wafer based on the calibrated data.

16. A method for calibrating target values of a wafer being processed, comprising:
    processing a wafer having first shot areas and second shot areas using initial data, wherein the initial data includes initial target values that include one of a vector for a wafer map, a table with numerical values for respective shot areas, coordinates for each shot area, or a set of polynomial regression coefficients for calculating coordinates of each shot area;
    measuring first errors of the first shot areas;
    estimating second errors of the second shot areas;
    generating estimated data including the first errors and the second errors,
    determining whether or not the first shot areas are outliers; and
    deleting the first errors of the first shot areas determined as the outliers, from the measured data;
    calculating calibrated data from differences between the estimated data and the initial data; and
    processing another wafer having first shot areas and second shot areas using the calibrated data,
    wherein estimating the second errors comprises:
        calculating first similarities relative to a distance between the first errors of the first shot areas;
        estimating second similarities between errors of the first shot areas and the second shot areas based on the first similarities;
        calculating weight values applied by the first errors of the first shot areas to the second errors of the second shot areas based on the first similarities and the second similarities; and
        estimating the second errors of the second shot areas based on the first errors, the first similarities, the second similarities, and the weight values.

17. The method of claim 16,
    wherein the first similarities are calculated from $$\gamma(h) = \frac{1}{2n} \sum_{i=1}^{n} [R(x_i) - R(x_i + h)]^2,$$

wherein $\gamma$ is the first similarity, h is the range of a distance between the first shot areas, n is the total number of the first shot areas disposed within the distance range, $R(x_i)$ is a first error of a specific first shot area, and $R(x_{i+h})$ is a first error of another first shot area spaced apart from the specific first shot area by the distance range h, and
    wherein calculating the first similarities comprises independently calculating an X-component first similarity based on only the first errors of the first shot areas disposed adjacent to one another in an X direction, and a Y-component first similarity based on only the first errors of the first shot areas disposed adjacent to one another in a Y direction.

18. The method of claim 16,
    wherein the weighted values are calculated from:

$$\begin{bmatrix} \lambda_A \\ \lambda_B \\ \lambda_C \\ \lambda_D \\ \vdots \\ \lambda_N \end{bmatrix} = \begin{bmatrix} \gamma_{AA} & \gamma_{AB} & \gamma_{AC} & \gamma_{AD} & \cdots & \gamma_{AN} \\ \gamma_{BA} & \gamma_{BB} & \gamma_{BC} & \gamma_{BD} & \cdots & \gamma_{BN} \\ \gamma_{CA} & \gamma_{CB} & \gamma_{CC} & \gamma_{CD} & \cdots & \gamma_{CN} \\ \gamma_{DA} & \gamma_{DB} & \gamma_{DC} & \gamma_{DD} & \cdots & \gamma_{DN} \\ \vdots & \vdots & \vdots & \vdots & \vdots & \vdots \\ \gamma_{NA} & \gamma_{NB} & \gamma_{NC} & \gamma_{ND} & \cdots & \gamma_{NN} \end{bmatrix}^{-1} \begin{bmatrix} \gamma_{AS} \\ \gamma_{BS} \\ \gamma_{CS} \\ \gamma_{DS} \\ \vdots \\ \gamma_{NS} \end{bmatrix},$$

wherein $\lambda_A$, $\lambda_B$, $\lambda_C$, $\lambda_D$ are weighted values applied by adjacent first shot areas to a selected second shot area, $\gamma_{AA} \sim \gamma_{AN}$, $\gamma_{BA} \sim \gamma_{BN}$, $\gamma_{CA} \sim \gamma_{CN}$, $\gamma_{DA} \sim \gamma_{DN}$, ..., $\gamma_{NA} \sim \gamma_{NN}$ are the first similarities between the first errors of the first shot areas ($\gamma_{AA}$, $\gamma_{BB}$, $\gamma_{CC}$, $\gamma_{DD}$, ..., $\gamma_{NN}$=0), and $\gamma_{AS}$, $\gamma_{BS}$, $\gamma_{CS}$, $\gamma_{DS}$, ..., $\gamma_{NS}$ are the second similarities between a second error of the selected second shot area and first errors of the adjacent first shot areas, and
    wherein the second errors are calculated from:

$$R_e = \sum_{i=1}^{N} \lambda_i R_i,$$

wherein $R_e$ is the second error of the selected second shot area, i is the number of the first shot areas, $\lambda$ is a weighted value applied by the first shot area i, and $R_i$ is the first error of the first shot area.

19. The method of claim 16, wherein determining whether or not the first shot areas are the outliers comprises:
    calculating absolute values of outlier factors of the respective first shot areas;
    setting a criterial outlier factor; and
    determining the first shot areas having outlier factors having larger absolute values than the criterial outlier factor as the outliers,
    wherein setting the criterial outlier factor comprises:
        setting a criterial error;
        setting the criterial outlier factor to a relatively small value when the first error of each of the first shot areas is larger than the criterial error; and setting the criterial outlier factor to a relatively large value when the first error of each of the first shot areas is smaller than the criterial error, and wherein calculating the outlier factors of the respective first shot areas comprises:

selecting one of the first shot areas;

selecting at least two first shot areas disposed adjacent to the one selected first shot area;

calculating a weighted mean of the one selected first shot area based on the first errors of the at least two adjacently disposed selected first shot areas;

calculating a difference between the weighted mean of the one selected first shot area and the first errors;

calculating a mean of all the first errors of all the first shot areas;

calculating a standard deviation of all the first errors of all the first shot areas; and dividing a value obtained by subtracting the mean from the difference between the weighted mean of the one selected first shot area and the first errors, by the standard deviation.

20. The method of claim 16, wherein the estimated data comprises:

X-component estimated data having X-component first errors and X-component second errors of the first and second shot areas; and Y-component estimated data having Y-component first errors and Y-component second errors of the first and second shot areas, and wherein the calibrated data includes X-component calibrated target values and Y-component calibrated target values of all the first and second shot areas.

* * * * *